United States Patent
Park et al.

(10) Patent No.: US 7,649,513 B2
(45) Date of Patent: Jan. 19, 2010

(54) ORGANIC LIGHT EMITTING DIODE DISPLAY

(75) Inventors: Kwon Shik Park, Seoul (KR); Soo Young Yoon, Goyang-si (KR); Min Doo Chun, Seoul (KR)

(73) Assignee: LG Display Co., Ltd, Seoul (KR)

( * ) Notice: Subject to any disclaimer, the term of this patent is extended or adjusted under 35 U.S.C. 154(b) by 556 days.

(21) Appl. No.: 11/473,320

(22) Filed: Jun. 23, 2006

(65) Prior Publication Data
US 2007/0008268 A1    Jan. 11, 2007

(30) Foreign Application Priority Data

| Jun. 25, 2005 | (KR) | ...................... 10-2005-0055393 |
| Jun. 28, 2005 | (KR) | ...................... 10-2005-0056551 |

(51) Int. Cl.
    *G09G 3/30* (2006.01)
(52) U.S. Cl. ............................. 345/76; 345/78; 345/79; 315/169.3
(58) Field of Classification Search .............. 315/169.3; 345/76, 77, 92, 204, 205, 690, 78
    See application file for complete search history.

(56) References Cited

U.S. PATENT DOCUMENTS

| 6,583,775 B1 * | 6/2003 | Sekiya et al. .................. 345/76 |
| 6,611,108 B2 * | 8/2003 | Kimura .................... 315/169.3 |
| 6,670,773 B2 * | 12/2003 | Nakamura et al. ........ 315/169.3 |
| 7,385,573 B2 * | 6/2008 | Osame et al. .................. 345/76 |
| 2002/0196213 A1 * | 12/2002 | Akimoto et al. ................ 345/82 |
| 2003/0214465 A1 * | 11/2003 | Kimura ....................... 345/76 |
| 2003/0234754 A1 * | 12/2003 | Abe et al. ...................... 345/76 |

FOREIGN PATENT DOCUMENTS

| CN | 1220740 | 6/1999 |
| CN | 1278635 | 1/2003 |

* cited by examiner

*Primary Examiner*—Douglas W Owens
*Assistant Examiner*—Ephrem Alemu
(74) *Attorney, Agent, or Firm*—McKenna Long & Aldridge

(57) ABSTRACT

An Organic light emitting diode display device includes: a pixel array having a plurality of scan lines and a plurality of data lines that cross each other, a plurality of power voltage supply lines to which a high level power supply voltage is supplied and that are substantially parallel to the data lines, a plurality of reset lines substantially parallel to the scan lines, a plurality of organic light emitting diodes that emit light due to the high level power supply voltage from the power voltage supply line, and a plurality of organic light emitting diode drive circuits that drive the organic light emitting diode with data from the data line in response to a scan signal from the scan line and that is initialized in response to a reset signal from the reset line; a scan drive circuit that supplies the scan signal to the scan lines; a reset drive circuit that supplies the reset signal to the reset lines that initializes the organic light emitting diode drive circuit; and a data drive circuit that supplies the data to the data lines respectively, wherein the scan drive circuit and the reset drive circuit are on a substrate including the pixel array.

26 Claims, 18 Drawing Sheets

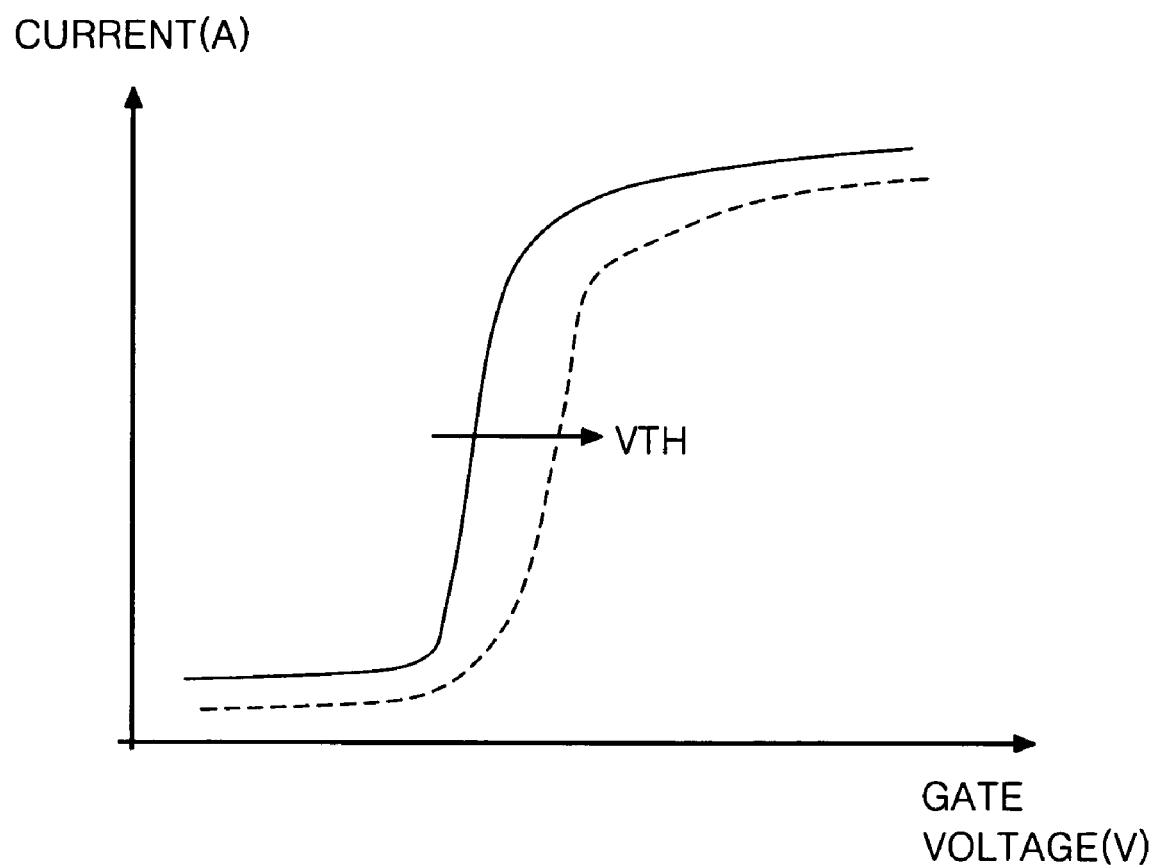

FIG.14
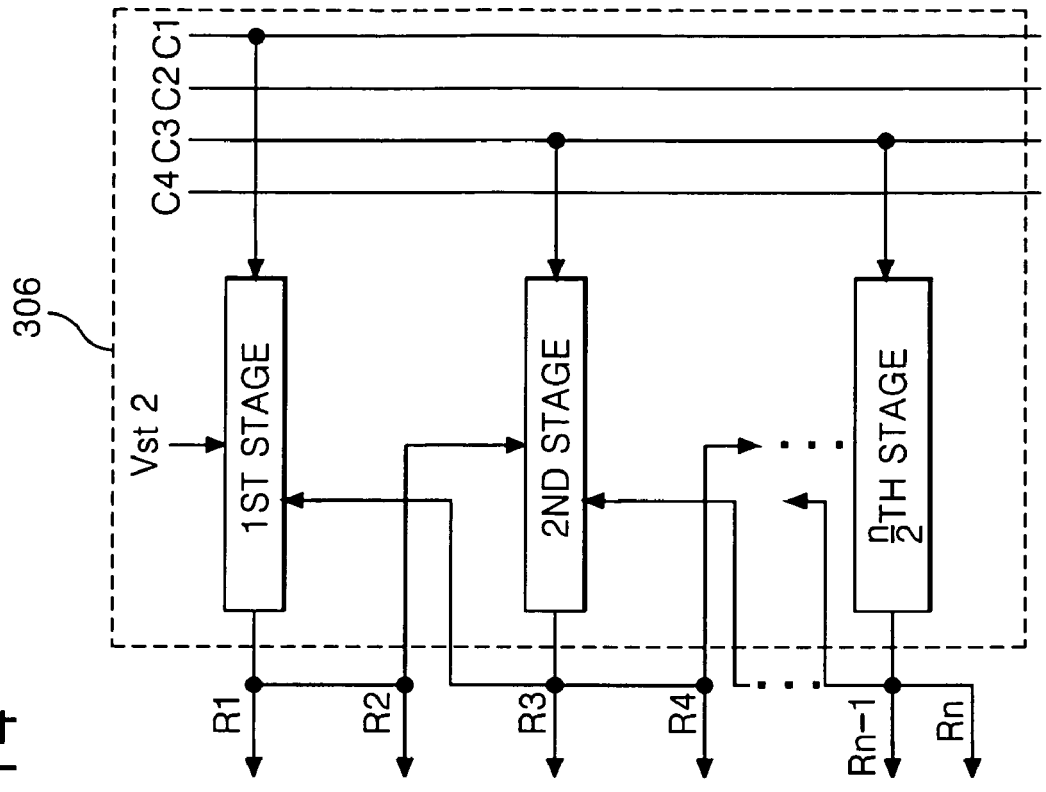
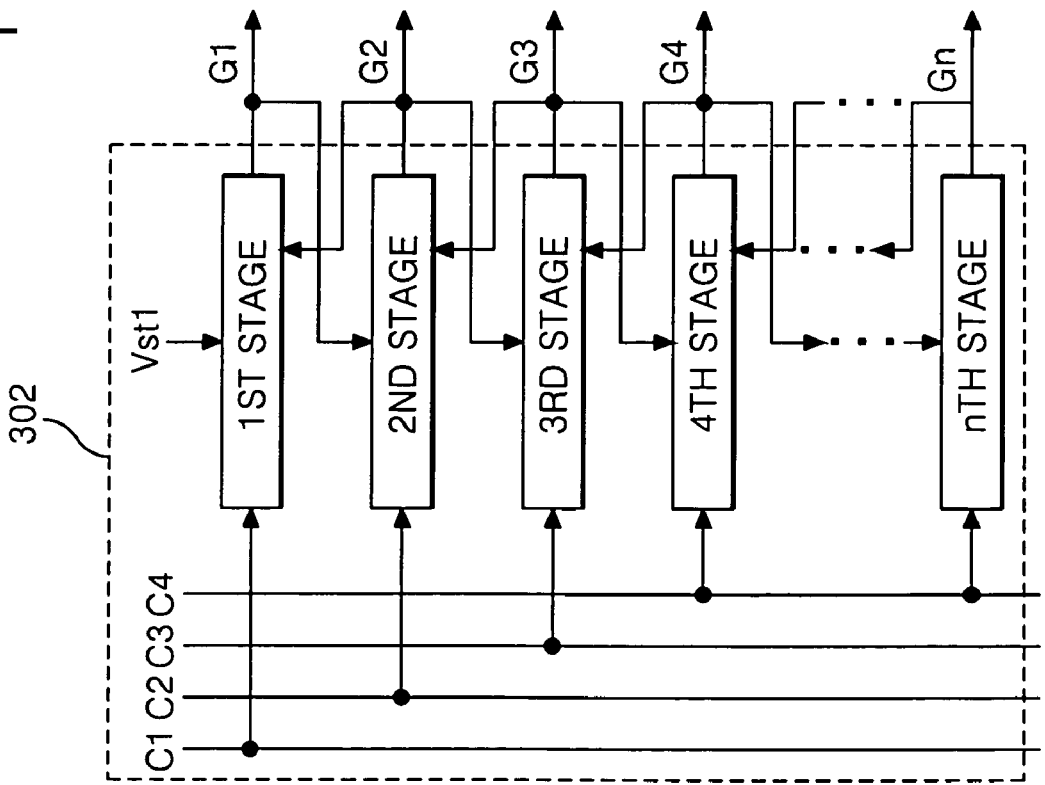

ORGANIC LIGHT EMITTING DIODE DISPLAY

This application claims the benefit of Korean Patent Application No. P2005-055393, filed on Jun. 25, 2005, and Korean Patent Application No. P2005-056551, filed on Jun. 28, 2005, which are hereby incorporated by reference for all purposes as if fully set forth herein.

BACKGROUND OF THE INVENTION

1. Field of the Invention

The present invention relates to an organic light emitting diode display device, and more particularly to an organic light emitting diode display device that compensates for a change in a device driving characteristic of the organic light emitting diode and for improving the reliability of the device.

2. Discussion of the Related Art

Recently, various flat panel display devices have been developed that have reduced weight and bulk that are capable of eliminating the disadvantages of a cathode ray tube (CRT). Such flat panel display devices include a liquid crystal display (LCD), a field emission display (FED), a plasma display panel (PDP) and a light emitting diode (LED) display, etc.

The LED display device of such display devices employs an LED including a phosphorous material capable of emitting light by a re-combination of electrons with holes. The LED display device is generally classified into an inorganic LED display device using an inorganic compound as the phosphorous material and an organic LED (OLED) display device using an organic compound as the phosphorous material. Such an OLED display device has the advantages of a low voltage driving, a self-luminescence, a thin thickness, a wide viewing angle, a fast response speed, high contrast, etc.

The OLED usually includes of an electron injection layer, an electron transport layer, a light-emitting layer, a hole transport layer and a hole injection layer that are disposed between a cathode and an anode. In such an OLED, when a predetermined voltage is applied between the anode and the cathode, electrons produced from the cathode are moved, via the electron injection layer and the electron transport layer, into the light-emitting layer while holes produced from the anode are moved, via the hole injection layer and the hole transport layer, into the light-emitting layer. Thus, the electrons and the holes fed from the electron transport layer and the hole transport layer emit light due to their re-combination in the light-emitting layer.

As shown in FIG. 1, an active matrix type OLED display device employing the above-mentioned OLED includes an OLED panel 13 having n×m number of pixels P[i,j] arranged in a n×m matrix at pixel areas defined by the crossing of n number of scan lines G1 to Gn (n is a positive integer) and m number of data lines D1 to Dm (m is a positive integer); a scan drive circuit 12 for driving the scan lines G1 to Gn of the OLED panel 13; a data drive circuit 11 for driving the data lines D1 to Dm of the OLED panel 13; and m number of power voltage supply lines S1 to Sm arranged in parallel to the data lines D1 to Dm for supplying a high level power supply voltage VDD to each pixel P[i,j]. Herein, P[i,j] is a pixel positioned at an $i^{th}$ row and a $j^{th}$ column, and i is a positive integer smaller than or equal to n and j is a positive integer smaller than or equal to m.

The scan drive circuit 12 include a plurality of gate drive integrated circuits. Each of gate drive integrated circuits includes a shift register sequentially shifting a scan signal to output for each horizontal period; a level shifter converting an swing width of output signal of the shift register into a swing width which is suitable for driving a pixel drive device, i.e., thin film transistor TFT; and an output buffer connected between the level shifter and the scan lines G1 to Gn.

The scan drive circuit 12 sequentially supplies the scan signal to the scan lines G1 to Gn to select a horizontal line of the organic light emitting diode panel 13 to which the data are supplied.

The data drive circuit 11 converts the digital data voltage input from the outside into an analog data voltage. The data drive circuit 11 supplies the analog data voltage to the data lines D1 to Dm whenever the scan signal is supplied.

Each of the pixels P[i,j] receives a data voltage from the data lines D1 to Dm when the scan signal is applied to the scan lines G1 to Gn, and generates light corresponding to the data voltage.

Each pixel P[i,j] includes an OLED having an anode connected to the power voltage supply lines S1 to Sm, and an OLED drive circuit 15 that is connected to the scan lines G1 to Gn and the data lines D1 to Dm and to which a low level power supply voltage VSS is supplied.

The OLED drive circuit 15 includes a first transistor T1 for supplying a data voltage from the data lines D1 to Dm to a first node N1 in response to the scan signal from the scan lines G1 to Gn; a second transistor T2 for controlling a current amount flowing in the OLED in response to a voltage of the first node N1; and a storage capacitor Cs in which the voltage of the first node N1 is charged.

The drive waveform of the OLED drive circuit 15 is as shown in FIG. 2. In FIG. 2, '1F' is one frame period, '1H' is one horizontal period, 'Vg_i' is a gate voltage supplied from the $i^{th}$ scan line G1, 'Pcs' is a scan signal, 'Vd_j' is a data voltage supplied from the $j^{th}$ data line Dj, 'VN1' is a voltage of the first node N1, and '$I_{OLED}$' is a current which flows through the OLED.

Referring to FIGS. 1 and 2, the first transistor T1 is turned on when the scan signal is applied thereto through the scan lines G1 to Gn, thereby supplying a data voltage Vd from the data lines D1 to Dm to the first node N1. The data voltage Vd supplied to the first node N1 is charged in the storage capacitor Cs and is supplied to a gate electrode of the second transistor T2. If the second transistor T2 is turned on by the data voltage Vd supplied in this manner, then the current flows through the OLED. At this time, the current flowing through the OLED is generated by the high level power supply voltage VDD, and the amount of the current is in proportion to the magnitude of the data voltage applied to the second transistor T2. Further, even when the first transistor T1 is turned off, the second transistor T2 stays turned by a voltage on the storage capacitor Cs to thereby control the amount of the current flowing in the OLED until the data voltage Vd of the next frame is supplied thereto.

The OLED display device of the related art as in FIGS. 1 and 2 has the following problems.

First, a positive data voltage Vd is applied for a long time to the gate electrode of the second transistor T2 that drives the OLED. A gate bias stress is accumulated in the second transistor T2 by the positive data voltage Vd, as shown in FIG. 3, as time passes. The accumulated gate bias stress causes a threshold voltage Vth of the second transistor T2 to be shifted. Due to the deterioration of the second transistor T2, the OLED display device of the related art becomes unstable in driving, and its reliability drops as time passes. FIG. 4B represents the change of the transistor caused by a negative gate bias stress when a negative current is repeatedly applied to the gate electrode of the transistor over a long time period, and an arrow mark in FIGS. 4A and 4B represents a movement of the threshold voltage Vth of the transistor.

Secondly, the reliability of the scan operation of the OLED display device of the related art decreases because an undesired voltage is applied to the gate line due to a charge remaining in control nodes which control the output of the scan drive circuit 12. Especially, if a Q node for increasing a shift register output of the scan drive circuit 12 is charged with the remaining charge for a non-scan period, then the undesired voltage appears in the gate line, thus a leakage current is generated in the transistors T1, T2 and the reliability of the scan operation decreases.

Thirdly, in the OLED display device of the related art, the cost of the drive circuit, such as the scan drive circuit 12, is high, and the manufacturing cost is high because of a process that adheres the scan drive circuit 12 to the substrate where the pixel array is formed.

SUMMARY OF THE INVENTION

Accordingly, the present invention is directed to an organic light emitting diode display that substantially obviates one or more of the problems due to limitations and disadvantages of the related art.

An advantage of the present invention is to provide an organic light emitting diode display device that prevents a characteristic change of a device that drives the organic light emitting diode and for improving the reliability of the device.

Another advantage of the present invention is to provide an organic light emitting diode display device that improves the reliability of driving the OLED by periodically discharging a residual charge of a scan line and a control node within a scan drive circuit.

Another advantage of the present invention is to provide an organic light emitting diode display device that reduces the circuit cost and the fabrication process complexity.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting diode display device according to an aspect of the present invention includes: a pixel array having a plurality of scan lines and a plurality of data lines that cross each other, a plurality of power voltage supply lines to which a high level power supply voltage is supplied and that are substantially parallel to the data lines, a plurality of reset lines substantially parallel to the scan lines, a plurality of organic light emitting diodes that emit light due to the high level power supply voltage from the power voltage supply line, and a plurality of organic light emitting diode drive circuits that drive the organic light emitting diode with data from the data line in response to a scan signal from the scan line and that is initialized in response to a reset signal from the reset line; a scan drive circuit that supplies the scan signal to the scan lines; a reset drive circuit that supplies the reset signal to the reset lines that initializes the organic light emitting diode drive circuit; and a data drive circuit that supplies the data to the data lines respectively, wherein the scan drive circuit and the reset drive circuit are on a substrate including the pixel array.

An organic light emitting diode display device according to another aspect of the present invention includes: a pixel array having a plurality of scan lines and a plurality of data lines that cross each other, a plurality of power voltage supply lines to which a high level power supply voltage is supplied and that are substantially parallel to the data lines, a plurality of reset lines substantially parallel to the scan lines, a plurality of organic light emitting diodes that emit light due to the high level power supply voltage from the power voltage supply line, and a plurality of organic light emitting diode drive circuits that drive the organic light emitting diode with data from the data line in response to a scan signal from the scan line and that is initialized in response to a reset signal from the reset line; a scan drive circuit that supplies the scan signals to the scan lines by plurality of stages that each have a first pull-up transistor that supplies the scan signal to the scan line in response to a voltage of a first Q node and a first pull-down transistor that discharges the scan line in response to a voltage of a first QB node; a reset drive circuit that supplies the reset signals to the reset lines by a plurality of stages that each have a second pull-up transistor that supplies the reset signal to the reset line in response to a voltage of a second Q node and a second pull-down transistor that discharges the reset line in response to a voltage of a second QB node; a first transistor that discharges the first Q node of the scan drive circuit in response to the reset signal; and a second transistor that discharges the second Q node of the reset drive circuit in response to the scan signal.

An organic light emitting diode display device according to still another aspect of the present invention includes: a pixel array having a plurality of scan lines and a plurality of data lines that cross each other, a plurality of power voltage supply lines to which a high level power supply voltage is supplied and that are substantially parallel to the data lines, a plurality of reset lines substantially parallel to the scan lines, a plurality of organic light emitting diodes that emit light due to the high level power supply voltage from the power voltage supply line, and a plurality of organic light emitting diode drive circuits that drive the organic light emitting diode with data from the data line in response to a scan signal from the scan line and that is initialized in response to a reset signal from the reset line; a scan drive circuit that supplies the scan signals to the scan lines by a plurality of stages that each have a first pull-up transistor that supplies the scan signal to the scan line in response to a voltage of a first Q node and a first pull-down transistor that discharges the scan line in response to a voltage of a first QB node; a reset drive circuit that supplies the reset signals to the reset lines by a plurality of stages that each have a first pull-up transistor that supplies the reset signal to the reset line in response to a voltage of a second Q node and a second pull-down transistor that discharges the reset line in response to a voltage of a second QB node; a first transistor that discharges the scan line in response to the reset signal; and a second transistor that discharges the reset line in response to the scan signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 4A is a diagram representing a characteristic change of a device caused by a positive gate bias stress;

FIG. 14 is a block diagram representing a third embodiment of the scan drive circuit and the reset drive circuit shown in FIG. 9, in detail;

DETAILED DESCRIPTION OF THE PREFERRED EMBODIMENT

Reference will now be made in detail to an embodiment of the present invention, examples of which are illustrated in the accompanying drawings.

With reference to FIGS. 5 to 17, embodiments of the present invention will be explained as follows.

Figure 1:
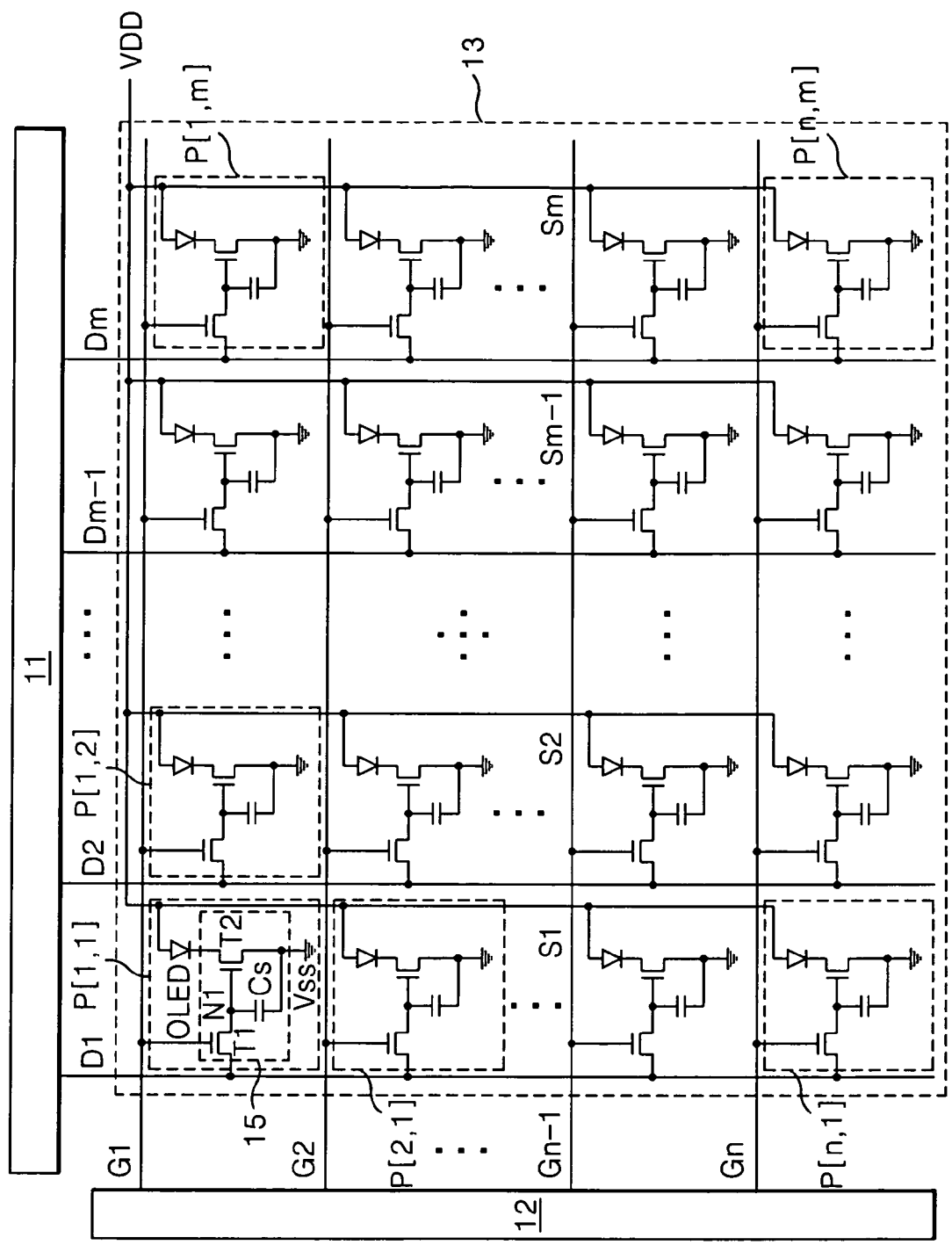
FIG. 1 is a diagram representing an organic light emitting diode display device of the related art.
Figure 2:
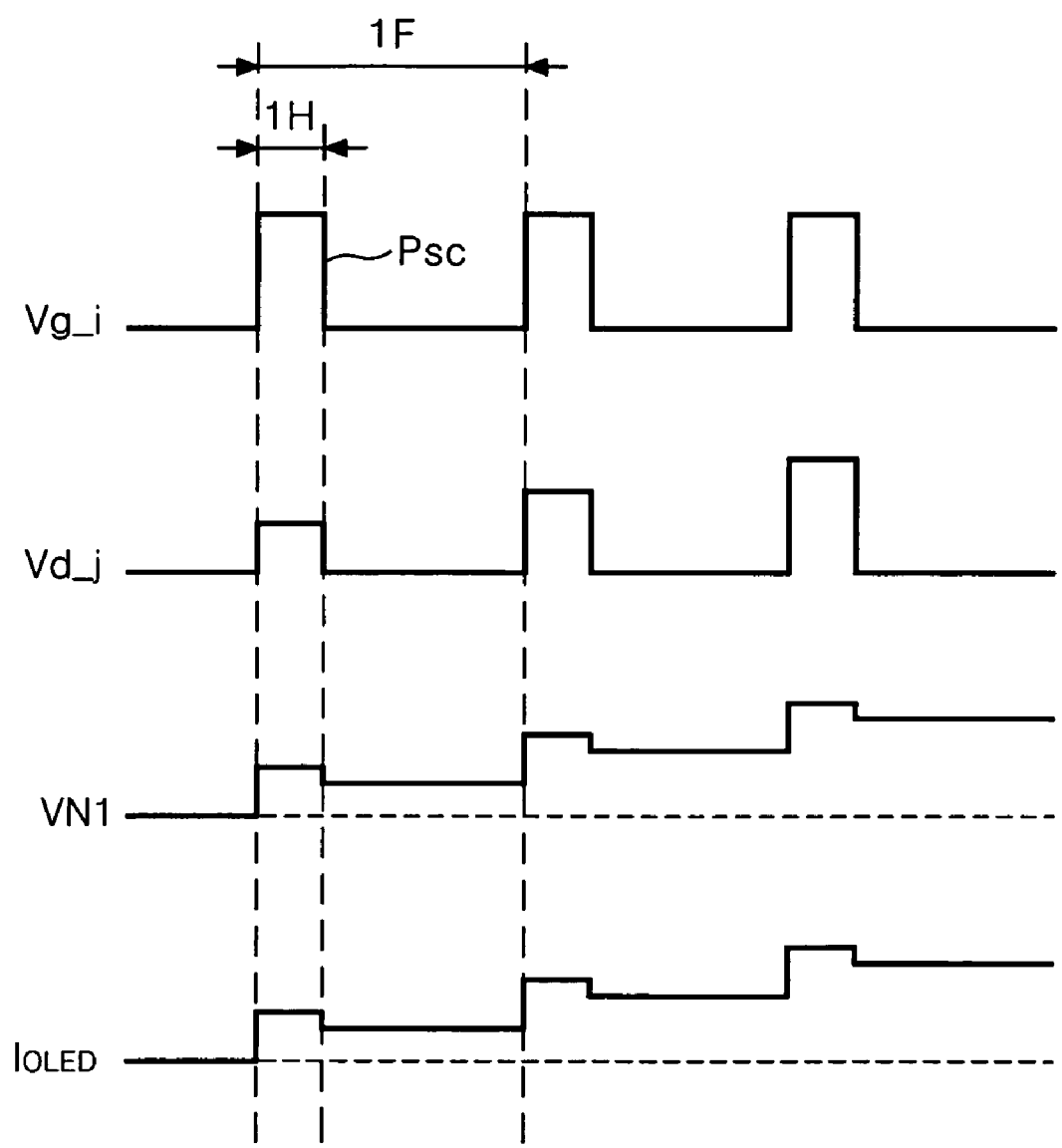
FIG. 2 is a diagram representing a drive waveform of a drive circuit of an organic light emitting diode of FIG. 1.
Figure 3:
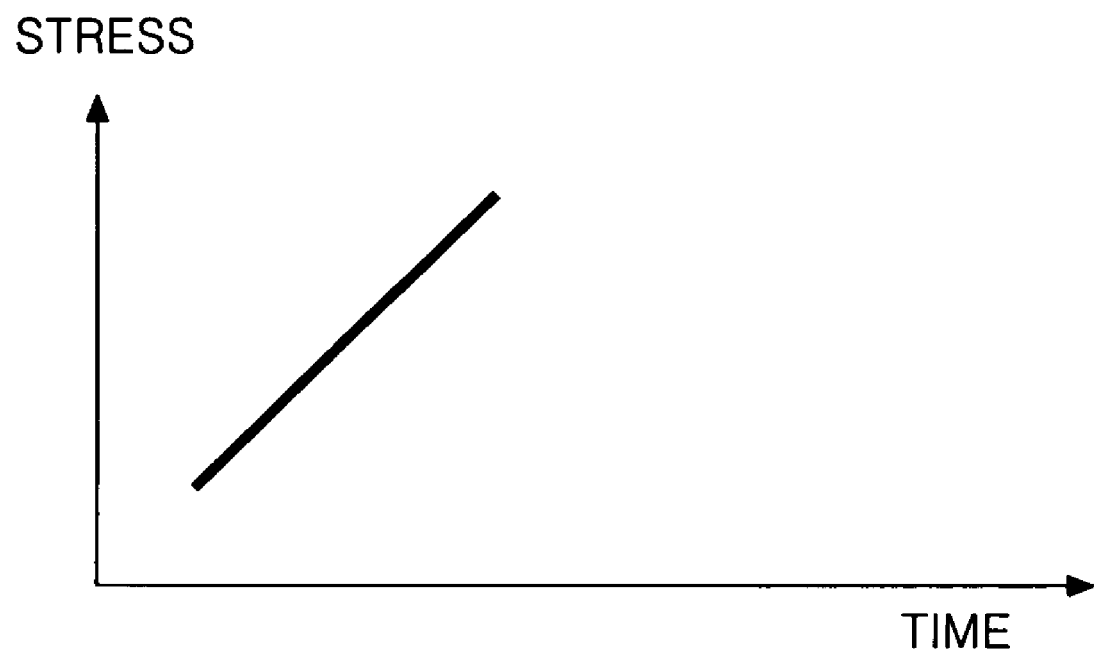
FIG. 3 is a diagram representing an accumulated gate bias stress in accordance with a voltage applying time.
Figure 4B:
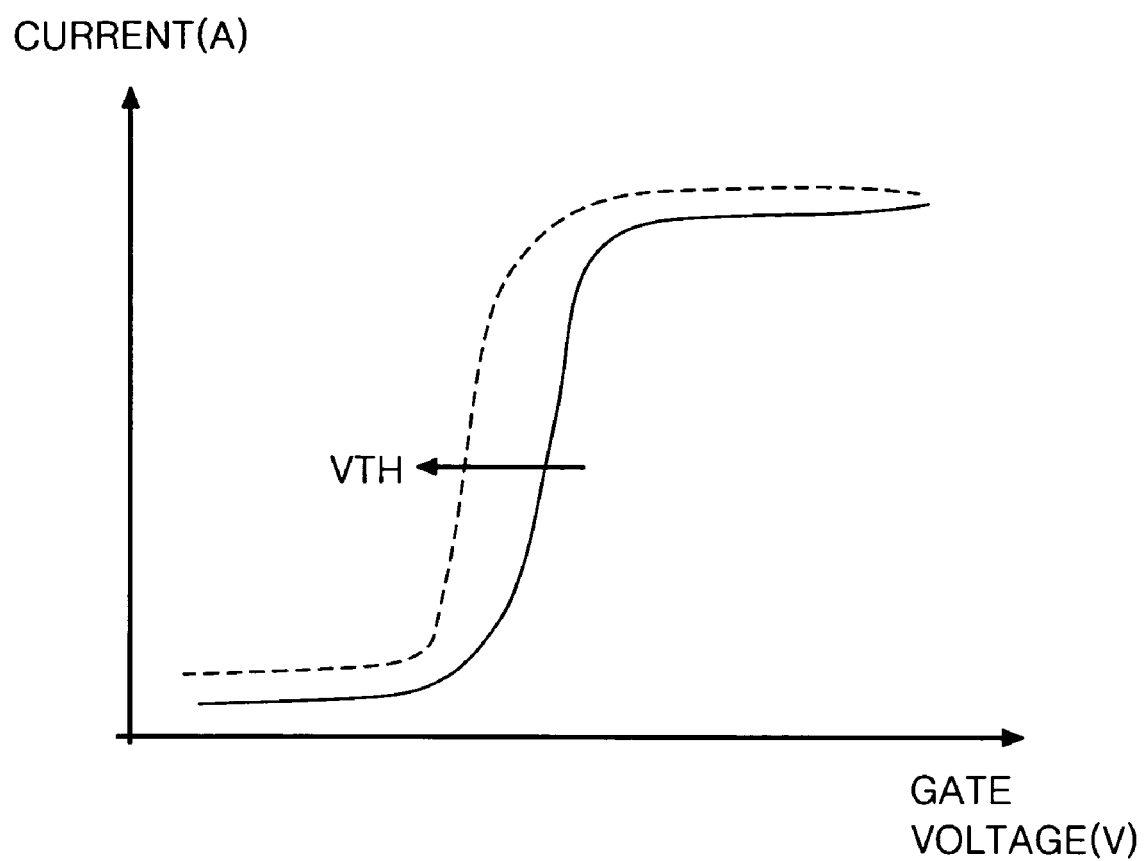
FIG. 4B is a diagram representing a characteristic change of a device caused by a negative gate bias stress.
Figure 5:
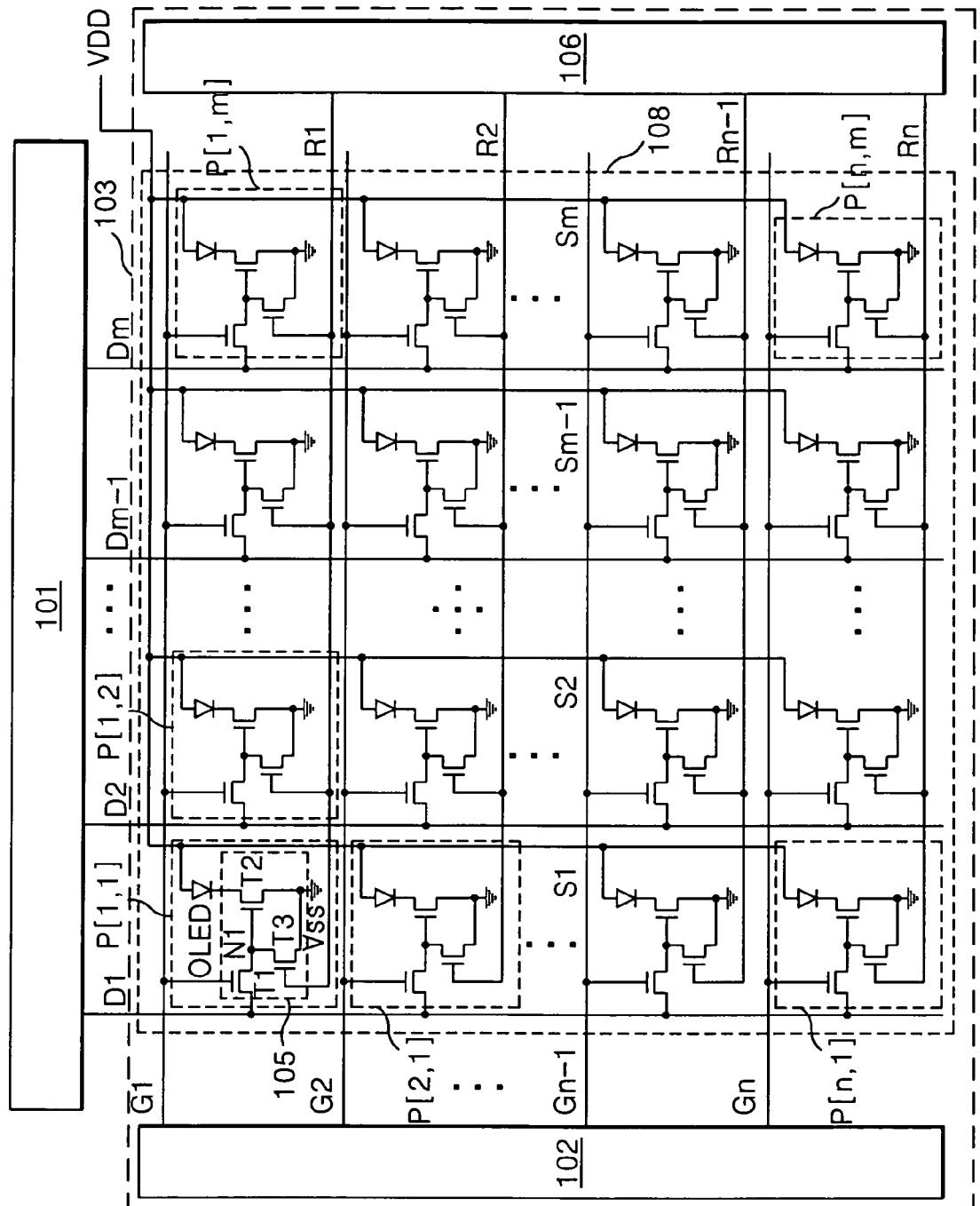
FIG. 5 is a block diagram representing an OLED display device according to a first embodiment of the present invention.

Referring to FIG. 5, an OLED display device according to an embodiment of the present invention includes n×m number of pixels P[i,j] arranged in an n×m matrix at pixel areas defined by the crossing of n number of scan lines G1 to Gn and m number of data lines D1 to Dm; m number of power voltage supply lines S1 to Sm arranged in parallel to the data lines D1 to Dm to supply the high level power supply voltage VDD to each of the pixels P[i,j]; reset lines R1 to Rn arranged in parallel to the scan lines G1 to Gn to supply a reset signal to each of the pixels P[i,j]; a scan drive circuit 102 for driving the scan lines G1 to Gn; a reset drive circuit 106 for driving the reset lines R1 to Rn; and a data drive circuit 101 for driving the data lines D1 to Dm.

The scan drive circuit 102 and the reset drive circuit 106 together with a pixel array are formed on a substrate where the pixel array is formed including of the data lines D1 to Dm, the scan lines G1 to Gn, the power voltage supply lines S1 to Sm and the pixels P[i,j] is formed.

The scan drive circuit 102 includes a shift register that sequentially shifts a scan signal for each horizontal period to output and sequentially supply the scan signal to the scan lines G1 to Gn.

The reset drive circuit 106 includes a shift register that outputs and sequentially supplies the reset signal to the reset lines R1 to Rn. The reset drive circuit 106 is formed at the side opposite to the scan drive circuit 102 with a display array area 108 therebetween.

The scan drive circuit 102 and the reset drive circuit 106 include a plurality of transistors using amorphous silicon (a-Si) like the TFT's of the pixel array so that they can be formed together at the same time as the pixel array on the same substrate. On the other hand, when the TFT's of the pixel array are formed of poly silicon, the TFT's of the scan drive circuit and the reset drive circuit 106 are also formed of poly silicon.

In this way, the scan drive circuit 102 and the reset drive circuit 106 that are formed embedded together with the pixel array in the OLED panel 103, thus circuit cost can be minimized and a process of forming a circuit or adhering to the pixel array substrate is not required.

The data drive circuit 101 converts the digital data input into an analog data voltage. The data drive circuit 101 supplies the analog data voltage to the data lines D1 to Dm whenever the scan signal is supplied.

Each of the pixels P[i,j] receives a data voltage from the data lines D1 to Dm to generate light corresponding to the data voltage when the scan signal is applied to the scan lines G1 to Gn, and a picture is displayed in a pixel area 108 including of the pixels P[i,j].

To this end, each pixel P[i,j] includes an OLED having an anode connected to the power voltage supply lines S1 to Sm and an OLED drive circuit 105 that is connected to the scan lines G1 to Gn, the data lines D1 to Dm and the reset lines R1 to Rn and to which a low level power supply voltage VSS is supplied.

The OLED drive circuit 105 includes: a first transistor T1 for supplying a data voltage from the data lines D1 to Dm to a first node N1 in response to the scan signal from the scan lines G1 to Gn; a second transistor T2 for controlling an amount of current flowing in the OLED in response to a voltage of the first node N1; and a third transistor T3 for discharging the first node in response to the reset signal from the reset lines R1 to Rn. The first to third transistors T1 to T3 are formed of amorphous silicon.

Figure 6:
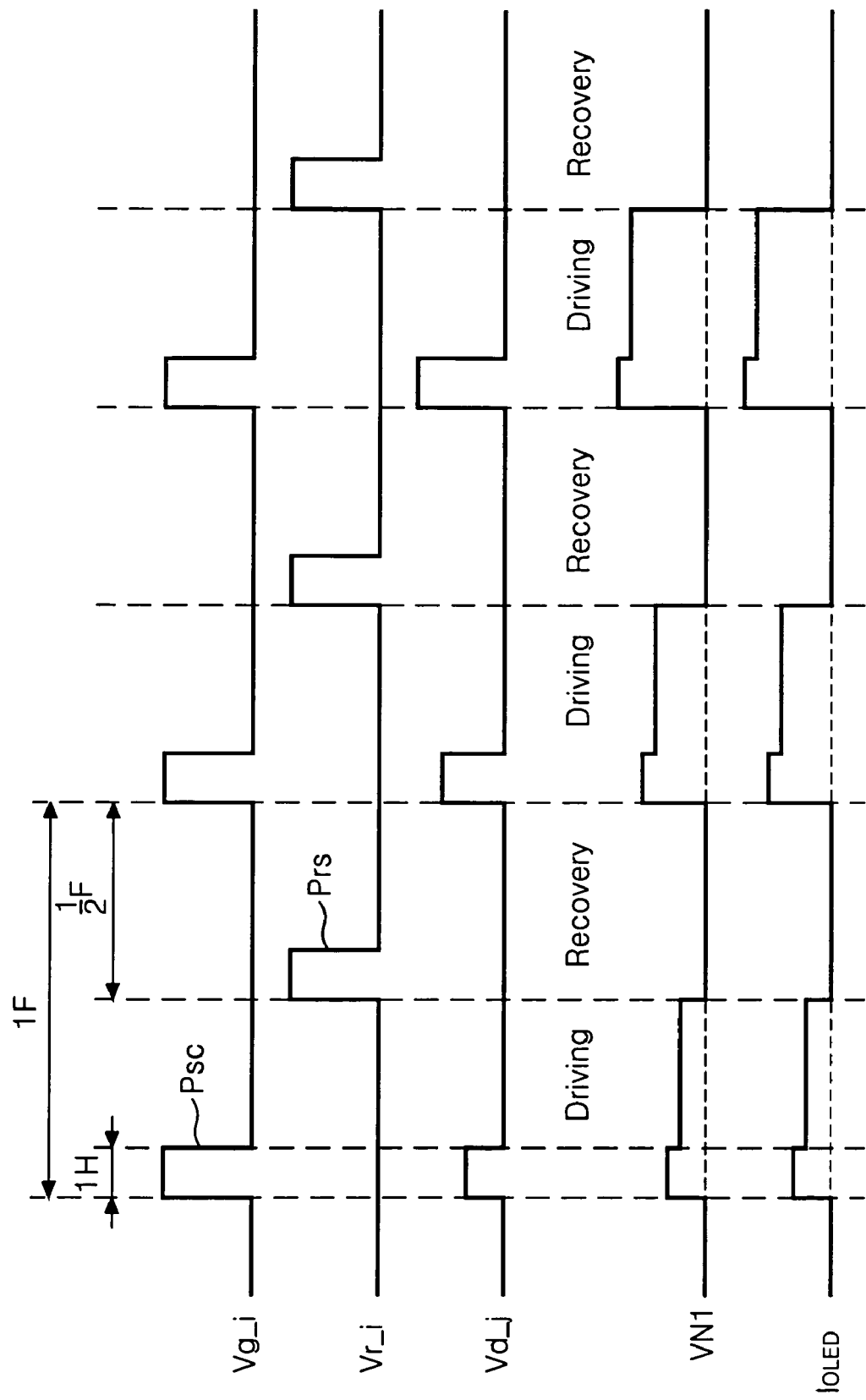
FIG. 6 is a waveform diagram representing an input/output waveform of the OLED display device shown in FIG. 5.

The drive waveform of the OLED drive circuit 105 is as shown in FIG. 6. In FIG. 6, '1F' is one frame period, '1H' is one horizontal period, 'Vg_i' is a gate voltage supplied from the $i^{th}$ scan line G1, 'Pcs' is a scan signal, 'Vd_j' is a data voltage supplied from the $j^{th}$ data line Dj, 'Vr_i' is a reset voltage supplied from the $i^{th}$ reset line Ri, 'Prs' is a reset signal, 'VN1' is a voltage of the first node N1, and '$I_{OLED}$' is a current which flows through the OLED.

In the OLED drive circuit 105, the first transistor T1 is turned on when the scan signal is applied thereto through the $i^{th}$ scan line, thereby supplying a data voltage Vd_j from the $j^{th}$ data line to the first node N1. The data voltage Vd_j supplied to the first node N1 is supplied to a gate electrode of the second transistor T2. If the second transistor T2 is turned on by the data voltage Vd_j supplied in this manner, then the current flows through the OLED. At this time, the current flowing through the OLED is generated by the high level power supply voltage VDD, and an amount of the current is in proportion to a magnitude of the data voltage Vd_j applied to the gate electrode of the second transistor T2. Further, even when the first transistor T1 is turned off, the second transistor T2 stays on due to the data voltage that is floated on the first node N1, and the third transistor T3 is turned on by the reset signal Prs supplied from the $i^{th}$ reset line Ri so as for the second transistor T2 to keep the turn-on state until the first node N1 is discharged. At this moment, the reset signal Prs from the $i^{th}$ reset line Ri is delayed by ½ frame period from the scan signal Psc to be supplied for each frame period.

Figure 7:
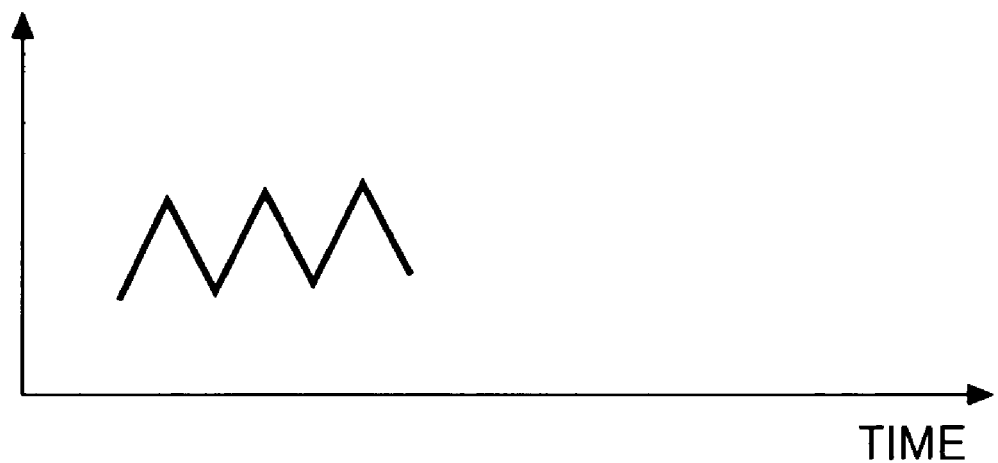
FIG. 7 is a graph representing a decrease of a gate bias stress in the OLED display device according to the embodiment of the present invention.

The voltage of the first node N1 is discharged through the third transistor T3 by the reset signal Prs generated ½ of the way into the frame period and delated from the scan signal Psc. Thus the second transistor T2 has a driving period of ½ the frame and a recovery period of ½ the frame. That is to say, as shown in FIG. 7, the gate bias stress increased by being accumulated in the second transistor T2 for the driving period of ½ the frame is decreased during the recovery period of ½ the frame.

In other words, the stress of the second transistor T2 for the first half frame period is recovered during the second half frame period, thereby preventing deterioration of the second transistor T2, i.e., the OLED drive device, so that it is possible to improve the reliability of the OLED drive circuit.

On the other hand, in this embodiment, the time difference between the scan signal Psc and the reset signal Prs is about ½ of the frame period, but the time difference can be adjusted in accordance with the panel characteristics and the TFT characteristics.

Figure 8:
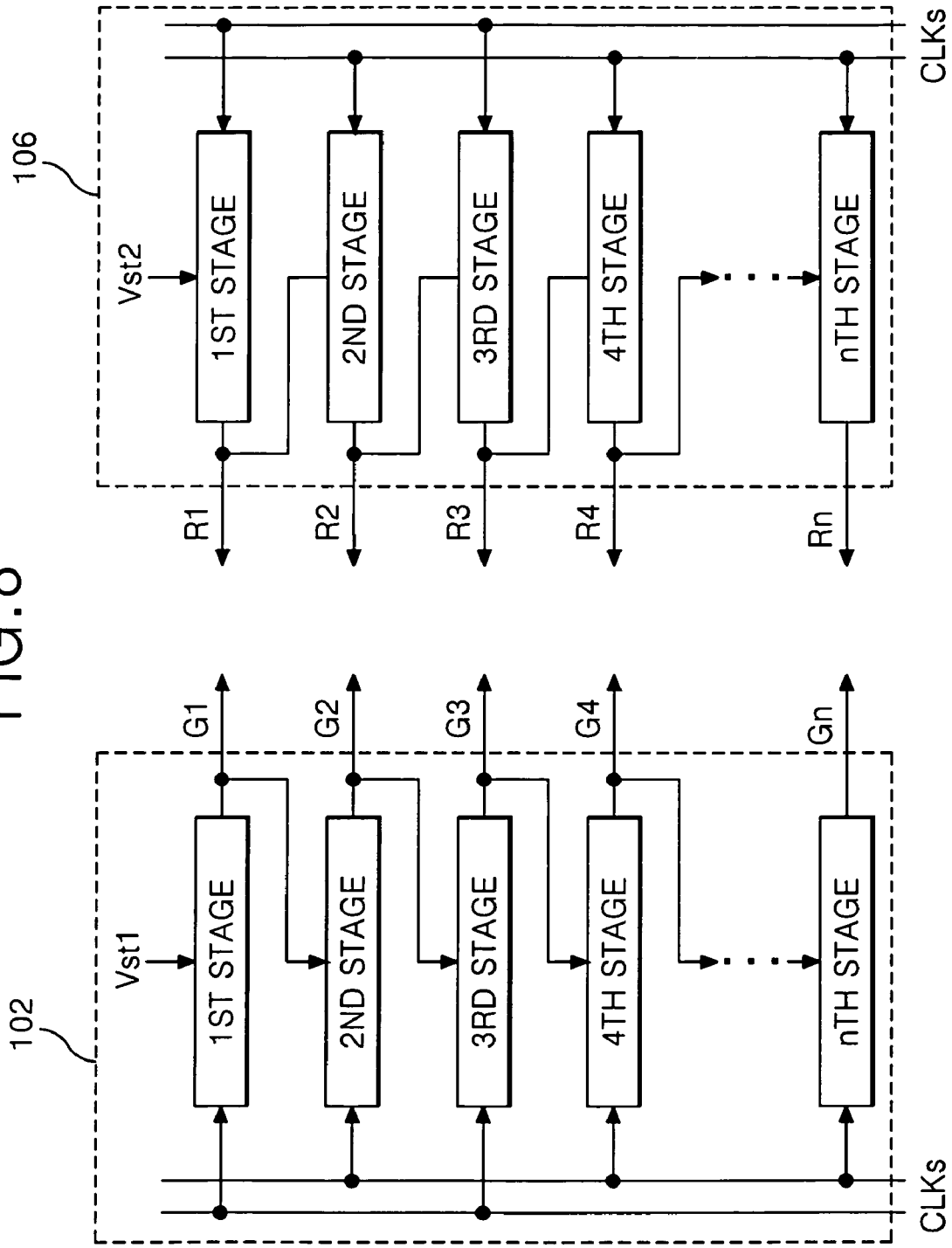
FIG. 8 is a block diagram representing a first embodiment of a scan drive circuit and a reset drive circuit shown in FIG. 5, in detail.

FIG. 8 represents a configuration of a scan drive circuit 102 and a reset drive circuit 106 for supplying a scan signal Psc and a reset signal Prs as described above.

Referring to FIG. 8, the scan drive circuit 102 includes a shift register composed of n stages that are connected in cascade. In the shift register, a first start signal Vst1 is input to the first stage, and an output signal of the pre-stage is sequentially input to the second and $n^{th}$ stages as a start signal. Further, each stage has the same circuit configuration and shifts the start signal Vst1 or the output signal of the pre-stage in response to the clock signal CLKs to generate a scan signal having a pulse having a period of about one horizontal period. The scan signal generated in this way is sequentially supplied to the scan lines G1 to Gn.

The reset drive circuit 106 includes a shift register having substantially the same circuit configuration as the scan drive circuit 102 and that sequentially supplies the reset signal that which is delayed versus the scan signal. A second start signal Vst2 is delayed by about ½ of the frame period versus the first start signal Vst1 and is applied to the reset lines R1 to Rn. In this way, there exists a time difference between the foregoing scan signal and reset signal caused by the time difference between the first start signal Vst1 and the second start signal Vst2. That is to say, the operation period and the recovery period of the OLED drive device can be controlled by controlling the start signals Vst1, Vst2.

In FIG. 8, the clock signal CLKs applied to the scan drive circuit 102 and the reset drive circuit 106 is exemplified as two two-phase clocks, but the clock signal can be the known three-phase clock, four-phase clock or higher-phase clock. Further, the scan drive circuit 102 and the reset drive circuit 106 can be driven with the same clock signal, or can be driven in response to the clock signals which are different from each other.

FIG. 5 shows an embodiment where the OLED drive circuit 105 of each pixel P[i,j] is connected to the cathode of the OLED, but it is also possible to have a structure where the OLED drive circuit 107 is connected to an anode of the OLED.

Figure 9:
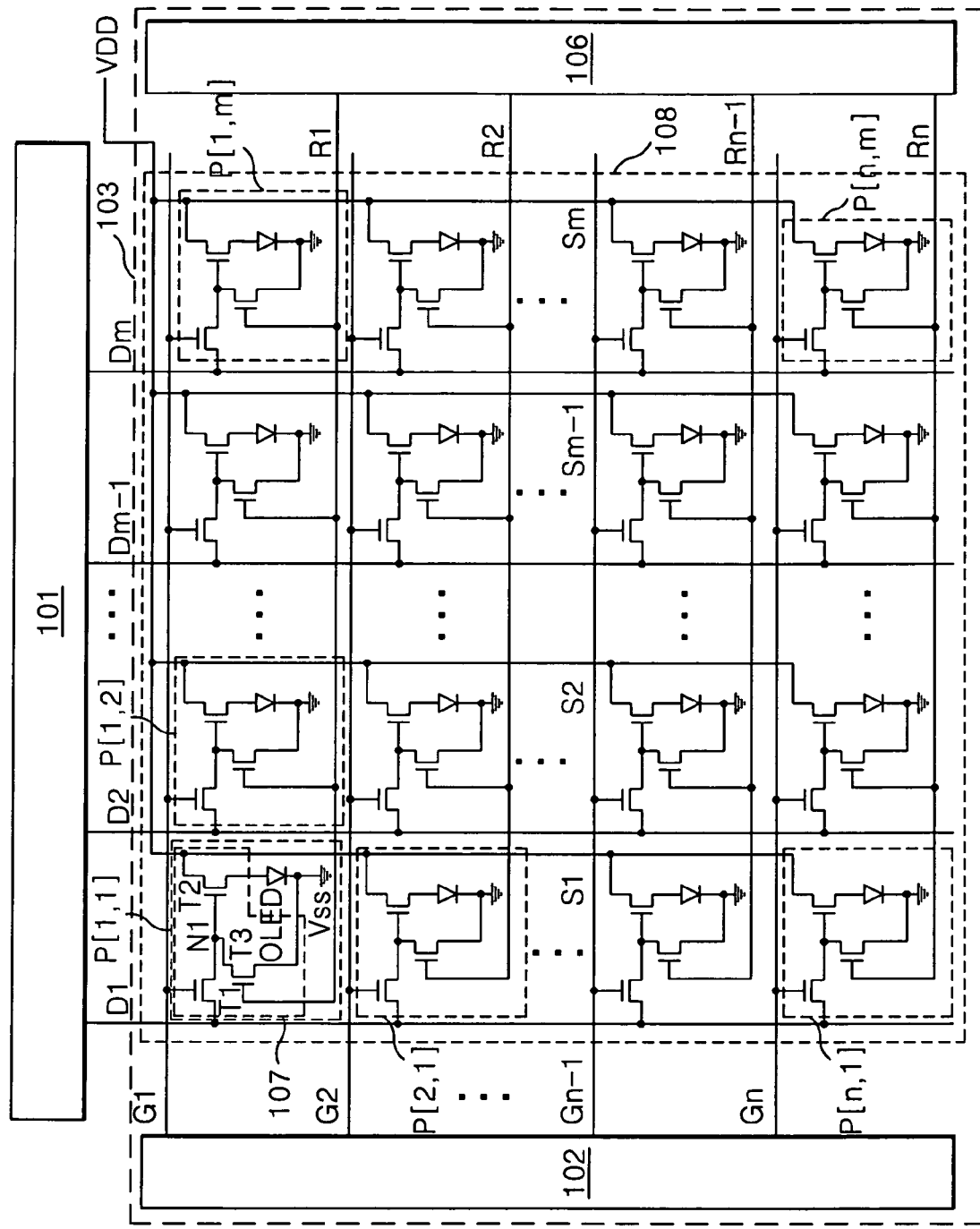
FIG. 9 is a block diagram representing an OLED display device according to a second embodiment of the present invention.
Figure 10:
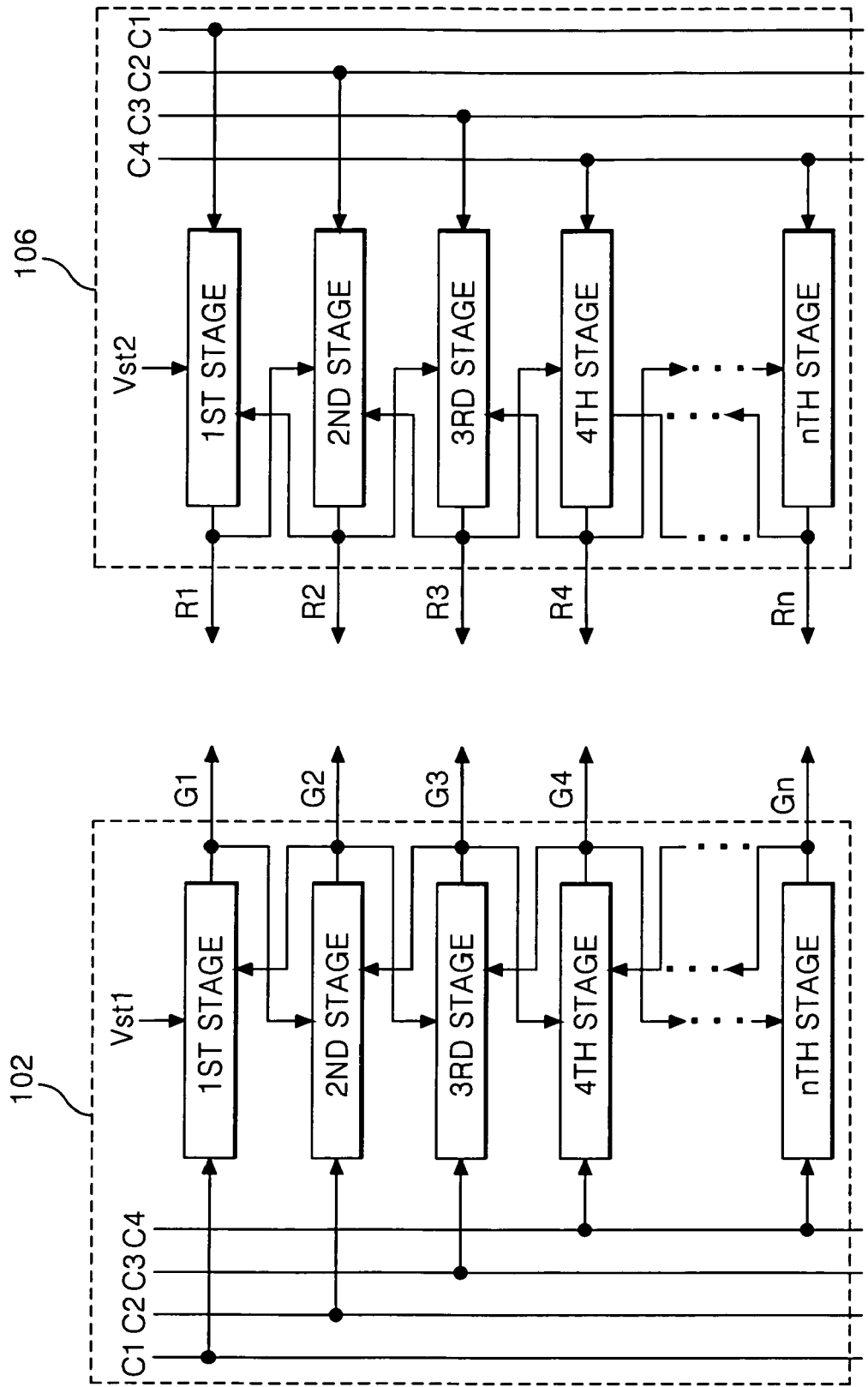
FIG. 10 is a block diagram representing a second embodiment of a scan drive circuit and a reset drive circuit shown in FIG. 5 or 9, in detail.

FIG. 10 is a block diagram representing a second embodiment of a scan drive circuit and a reset drive circuit of FIG. 5 or 9.

Referring to FIG. 10, the scan drive circuit 102 and the reset drive circuit 106 each includes n stages ($1^{st}$ to $n^{th}$ stages) that are connected in cascade.

In the scan drive circuit 102, a first start signal Vst1 is input to a first stage, and a pre-stage scan signal Vg_i−1 is input to second to $n^{th}$ stages as the start signal. The next-stage scan signal Vg_i+1 is input to the first to $(n−1)^{th}$ stages as a stage reset signal, and a stage reset signal from a dummy stage (not shown) is input to the $n^{th}$ stage. Further, each stage substantially has the same circuit configuration and shifts the first start signal Vst1 or pre-stage scan signal Vg_i in response to any one clock signal among four clock signals C1 to C4, thereby generating a scan signal having a pulse width of one horizontal period.

The second start signal Vst2 is generated later than the first start signal Vst1. Accordingly, the reset signal is delayed by a designated time versus the scan signal supplied to the scan lines G1 to Gn.

Figure 11:
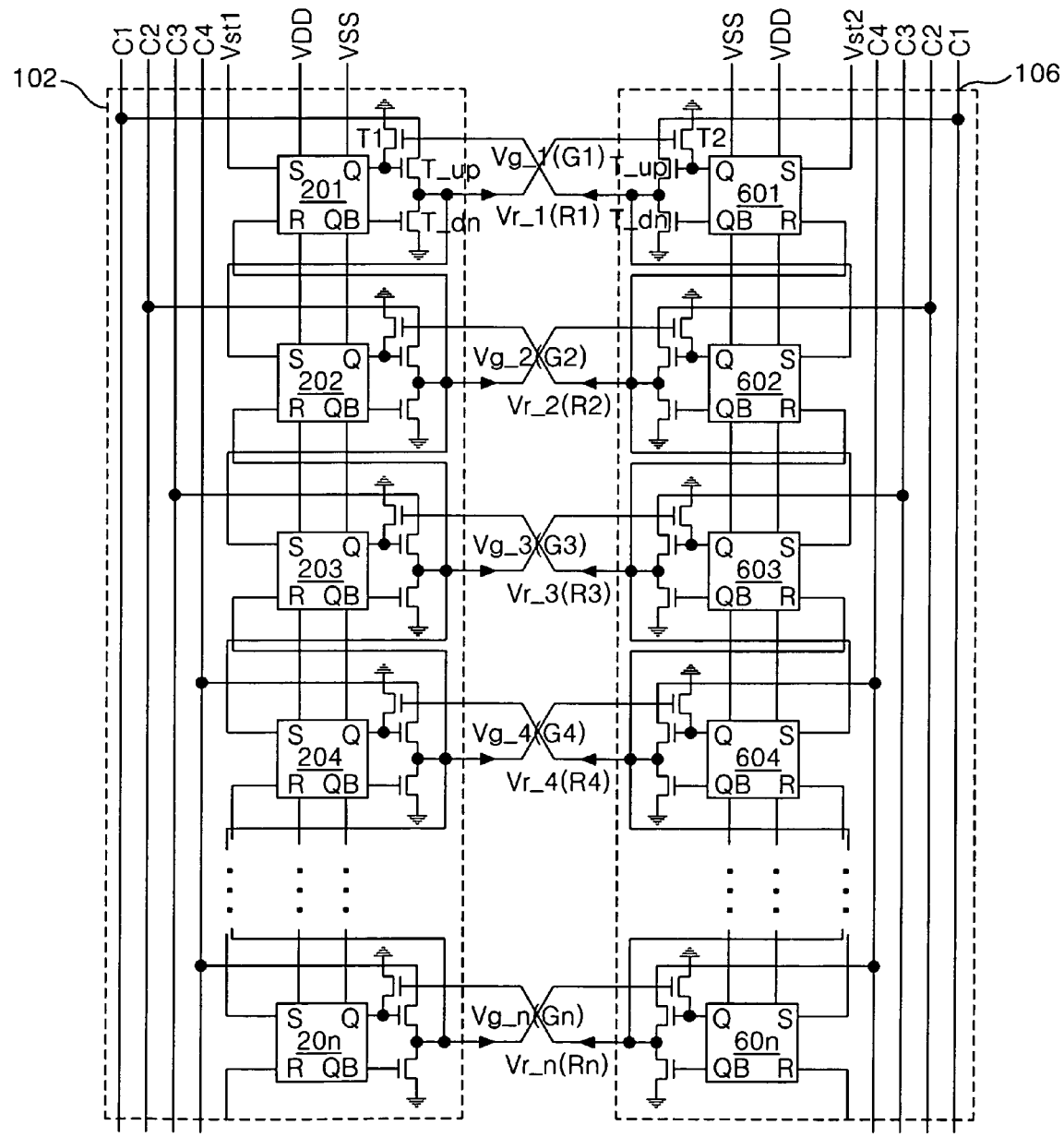
FIG. 11 is a circuit diagram representing a first embodiment of a scan drive circuit and a reset drive circuit shown in FIG. 10, in detail.

FIG. 11 is a circuit diagram representing a first embodiment of the scan drive circuit and the reset drive circuit of FIG. 10 in detail.

Referring to FIG. 11, the scan drive circuit 102 includes a first transistor T1 that discharges a Q node of the stage 201 to 20n in response to the reset signal Vr_1 to Vr_n from the reset lines R1 to Rn, and the reset drive circuit 106 includes a second transistor T2 that discharges a Q node of the stage 601 to 60n in response to the scan signal Vg from the scan lines G1 to Gn.

In the scan drive circuit 102, if the start signal Vst1 is input to a set terminal S of the first stage 201, the Q node is charged and the QB node is discharged in the stage 201. Subsequently, the first scan signal Vg_1 is supplied to the first scan line G1 through a pull-up transistor T-up when the first clock signal C1 having a high logic voltage is input to the first stage 201 when the Q node is charged. At the same time, the first scan signal Vg_1 is supplied to the set terminal S of the second stage 202 to charge the Q node of the second stage 202 and to discharge a QB node of the second stage 202. Further, the first scan signal Vg_1 is applied to a gate electrode of the second transistor T2 of the reset drive circuit 106. Accordingly, the second transistor T2 is turned on by the first scan signal Vg_1 to discharge the Q node of the first stage 601 in the reset drive circuit 106.

Subsequently, the second scan signal Vg_2 generated in the second stage 202 by the second clock signal C2 is supplied to the second scan line G2 and, at the same time, is supplied to the reset terminal R of the first stage 201 as a stage reset signal. The second scan signal Vg_2 discharges the Q node of the first stage 201 and charges the QB node. Accordingly, the first scan line G1 is discharged through the pull-down transistor T_dn when the second scan signal Vg_2 is generated. Further, the second scan signal Vg_2 is applied to the gate electrode of the second transistor T2 of the second stage 602 included in the reset drive circuit 106. Accordingly, the second transistor T2 is turned on by the second scan signal Vg_2 to discharge the Q node of the second stage 602 in the reset drive circuit 106.

In the same manner, a third scan signal Vg_3 output from the third stage 203 is supplied to the third scan line G3 and, at the same time, initializes the second stage 202 as the stage reset signal. With such operations, the scan drive circuit 102 sequentially supplies the scan signal to the scan lines G1 to Gn and discharges the Q node of the reset drive circuit 106.

The reset operation of the reset drive circuit 106 is substantially made in the same manner as the foregoing scan drive circuit 102.

In the reset drive circuit 106, if the start signal Vst2 is input to a set terminal S of the first stage 601, the Q node is charged, and the QB node is discharged in the stage 601. Subsequently, the first clock signal C1 having a high logic voltage is supplied to the first reset line R1 through the pull-up transistor T-up as a first reset signal Vr_1 when the Q node is charged. At the same time, the first reset signal Vr_1 is supplied to the set terminal S of the second stage 602 to charge the Q node of the second stage 602 and to discharge a QB node of the second stage 602. Further, the first reset signal Vr_1 is applied to a gate electrode of the first transistor T1. Accordingly, the first transistor T1 is turned on by the first reset signal Vr_1 to discharge the Q node of the first stage 201 in the scan drive circuit 102.

Subsequently, the second reset signal Vr_2 generated in the second stage 602 by the second clock signal C2 is supplied to the second reset line R2 and at the same time, is supplied to the reset terminal R of the first stage 601 as a stage reset signal. The second reset signal Vr_2 discharges the Q node of the first stage 601 and charges the QB node. Accordingly, the first reset line R1 is discharged through the pull-down transistor T_dn when the second reset signal Vr_2 is generated. Further, the second reset signal Vr_2 is applied to the gate electrode of the first transistor T1 of the second stage 202 included in the scan drive circuit 102. Accordingly, the first transistor T1 is turned on by the second reset signal Vr_2 to discharge the Q node of the second stage 201 in the scan drive circuit 102.

In the same manner, a third reset signal Vr_3 output from the third stage 603 is supplied to the third reset line R3 and, at the same time, initializes the second stage 602 as the stage reset signal. With such operations, the reset drive circuit 106 sequentially supplies the reset signal to the reset lines R1 to Rn and discharges the Q node of the scan drive circuit 102.

In this way, the scan drive circuit 102 and the reset drive circuit 106 discharge the Q node with the output of another stage, thus it is possible to prevent a malfunction of the OLED caused by an excessive charge on the Q node and to improve reliability of the circuits.

Figure 12:
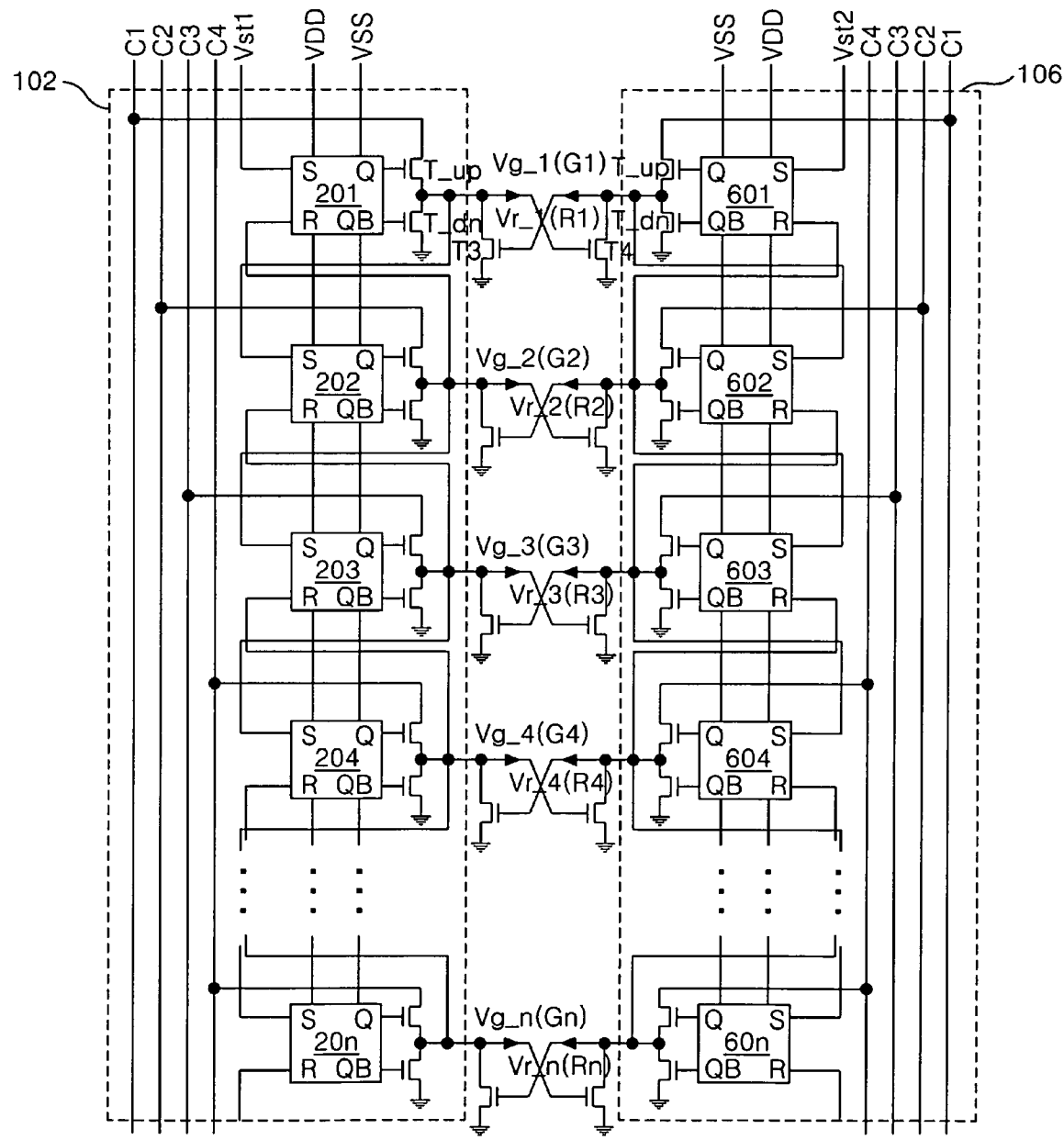
FIG. 12 is a circuit diagram representing a second embodiment of the scan drive circuit and the reset drive circuit shown in FIG. 10, in detail.

FIG. 12 is a circuit diagram representing a second embodiment of the scan drive circuit and the reset drive circuit of in FIG. 10 in detail.

Referring to FIG. 12, the scan drive circuit 102 includes a third transistor T3 that discharges the scan lines G1 to Gn in response to the reset signal Vr_1 to Vr_n from the reset lines R1 to Rn, and the reset drive circuit 106 includes a fourth transistor T4 which discharges the reset lines R1 to Rn in response to the scan signals Vg_1 to Vg_n from the scan lines G1 to Gn.

A source electrode of the third transistor T3 is connected to the scan lines G1 to Gn and a drain electrode thereof is connected to a low level power supply voltage source VSS. A gate electrode of the third transistor T3 is connected to the reset lines R1 to Rn.

A source electrode of the fourth transistor T4 is connected to the reset lines R1 to Rn and a drain electrode thereof is connected to a low level power supply voltage source VSS. A gate electrode of the fourth transistor T4 is connected to the scan lines G1 to Gn.

In the scan drive circuit 102, if the start signal Vst1 is input to the first stage 201, the Q node is charged in the first stage 201 and the QB node is discharged. If the first clock signal with a high voltage is supplied to the source electrode of the pull-up transistor T-up when the Q node of the first stage 201 is charged, the first scan signal Vg_1 is supplied to the first scan line G1 and at the same time is supplied to the set terminal S of the second stage 202 as the start signal, thereby charging the Q node of the second stage 202 and discharging the QB node of the second stage 202. Further, the first scan signal Vg_1 is applied to the gate electrode of the fourth transistor T4 connected to the first reset line R1 to discharge the first reset line R1.

The second scan signal Vg_2 generated in the second stage 202 of the scan drive circuit 102 by the second clock signal C2 is supplied to the second scan line G2 and, at the same time, is supplied to the reset terminal R of the first stage 201, thereby discharging the Q node of the first stage 201 and charging the QB node of the fist stage 201. Accordingly, if the second scan signal Vg_2 is generated, the pull-down transistor T_dn of the first stage 201 is turned on to discharge the first scan line G1 to the low level power supply voltage VSS and, at the same time, the pull-up transistor T_up of the second stage 202 is turned on to charge the second scan line G2 to the voltage of the second clock signal C2. Further, the second scan signal Vg_2 is applied to the gate electrode of the fourth transistor T4 connected to the second reset line R2 to discharge the second reset line R1.

With such operations, the scan drive circuit 102 sequentially supplies the scan signals Vg_1 to Vg_n to the scan lines G1 to Gn and initializes the pre-stage stage at the same time. Further, the scan drive circuit 102 sequentially discharges the reset lines R1 to Rn.

In the reset drive circuit 106, if the start signal Vst2 is input to the first stage 601, the Q node is charge in the first stage 601 and the QB node is discharged. If the first clock signal with a high voltage is supplied to the source electrode of the pull-up transistor T-up when the Q node of the first stage 601 is charged, the first reset signal Vr_1 is supplied to the first reset line R1 and, at the same time, is supplied to the set terminal S of the second stage 602 as the start signal, thereby charging the Q node of the second stage 602 and discharging the QB node of the second stage 602. Further, the first reset signal Vr_1 is applied to the gate electrode of the third transistor T3 connected to the first scan line G1 to discharge the first scan lien G1.

The second scan signal Vg_2 generated in the second stage 602 of the scan drive circuit 106 by the second clock signal C2 is supplied to the second reset line R2 and, at the same time, is supplied to the reset terminal R of the first stage 601, thereby discharging the Q node of the first stage 601 and charging the QB node of the fist stage 601. Accordingly, if the second reset signal Vr_2 is generated, the pull-down transistor T_dn of the first stage 601 is turned on to discharge the first reset line R1 to the low level power supply voltage VSS and, at the same time, the pull-up transistor T_up of the second stage 602 is turned on to charge the second reset line R2 to the voltage of the second clock signal C2. Further, the second reset signal Vr_2 is applied to the gate electrode of the third transistor T3 connected to the second scan line G2 to discharge the second scan line G1.

With such operations, the reset drive circuit 106 sequentially supplies the reset signal Vr_1 to Vr_n to the reset lines R1 to Rn and initializes the pre-stage stage at the same time. Further, the reset drive circuit 106 sequentially discharges the scan lines G1 to Gn.

Figure 13:
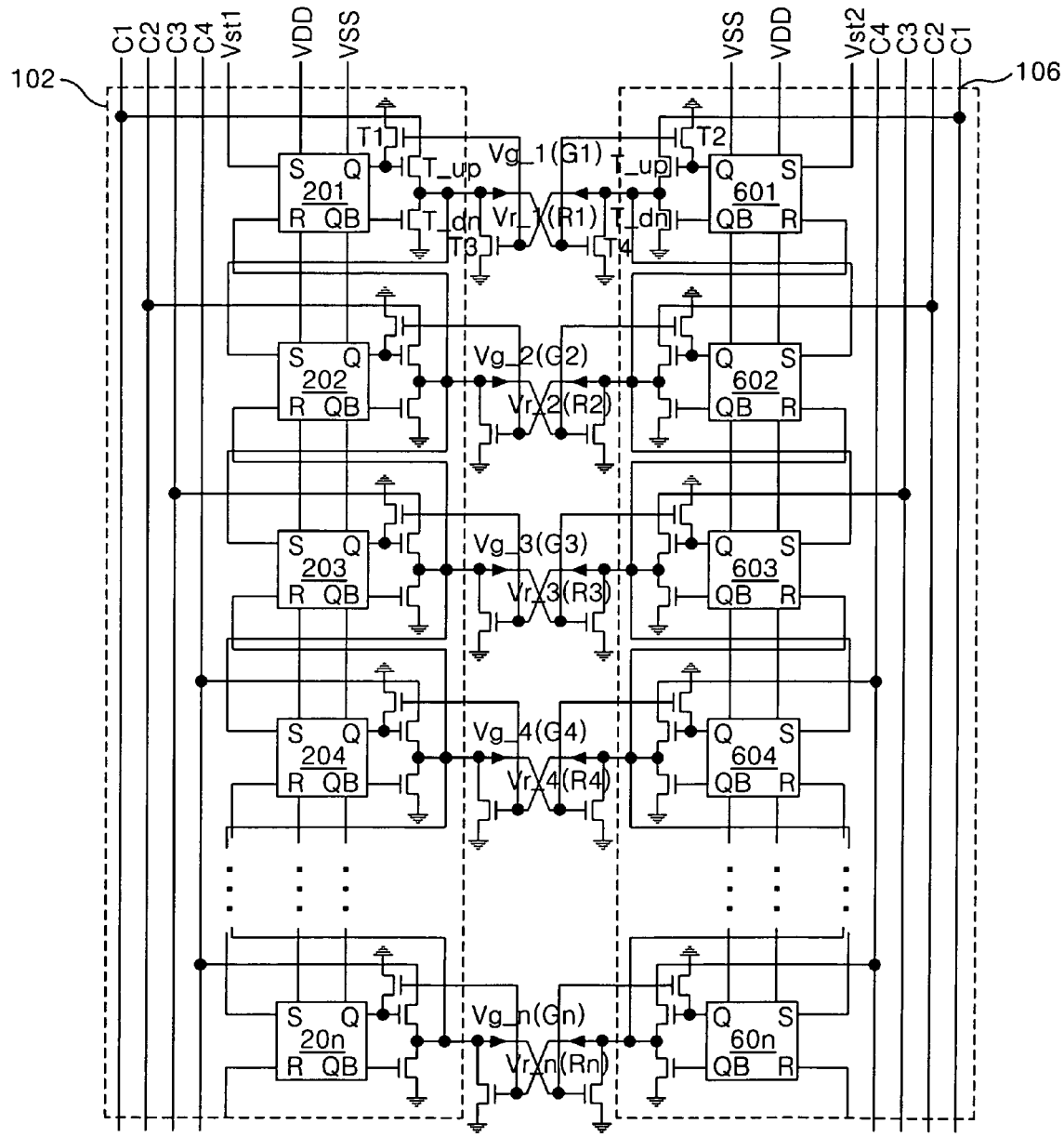
FIG. 13 is a circuit diagram representing a third embodiment of the scan drive circuit and the reset drive circuit shown in FIG. 10, in detail.

FIG. 13 is a circuit diagram representing a third embodiment of the scan drive circuit and a reset drive circuit shown in FIG. 10, in detail.

Referring to FIG. 13, the scan drive circuit 102 includes a first transistor T1 that discharges the Q node of the stage 201 to 20n in response to the reset signal Vr_1 to Vr_n from the reset lines R1 to Rn; and a third transistor T3 that discharges the scan lines G1 to Gn in response to the reset signal Vr_1 to Vr_n.

The reset drive circuit 106 includes a second transistor that discharges the Q node of the stage 601 to 60n in response to the scan signal Vg from the scan lines G1 to Gns; and a fourth transistor T4 that discharges the reset lines R1 to Rn in response to the scan signals Vg_1 to Vg_n from the scan lines G1 to Gn.

A source electrode of the first transistor T1 is connected to the Q node of the stages 201 to 20n included in the scan drive circuit 102, and a drain electrode thereof is connected to the low level power supply voltage source VSS. A gate electrode of the first transistor T1 is connected to the reset lines R1 to Rn.

A source electrode of the second transistor T2 is connected to the Q node of the stages 601 to 60n included in the reset drive circuit 106, and a drain electrode thereof is connected to the low level power supply voltage source VSS. A gate electrode of the second transistor T2 is connected to the reset lines R1 to Rn.

A source electrode of the third transistor T3 is connected to the scan lines G1 to Gn, and a drain electrode thereof is connected to the low level power supply voltage source VSS. A gate electrode of the third transistor T3 is connected to the reset lines R1 to Rn.

A source electrode of the fourth transistor T4 is connected to the reset lines R1 to Rn, and a drain electrode thereof is connected to the low level power supply voltage source VSS. A gate electrode of the fourth transistor T4 is connected to the scan lines G1 to Gn.

The scan drive circuit 102 and the reset drive circuit 106 shown in FIG. 13 are an embodiment where the circuit configurations of the scan drive circuit 102 and the reset drive circuit 106 shown in FIGS. 11 and 12 are combined.

In the scan drive circuit 102, if the start signal Vst1 is input to the first stage 201, the Q node is charged in the first stage 201 and the QB node is discharged. If the first clock signal with a high voltage is supplied to the source electrode of the pull-up transistor T-up when the Q node of the first stage 201 is charged, the first scan signal Vg_1 is supplied to the first scan line G1 and at the same time is supplied to the set terminal S of the second stage 202 as the start signal, thereby charging the Q node of the second stage 202 and discharging the QB node of the second stage 202. Further, the first scan signal Vg_1 causes the second and fourth transistors T2, T4 of the first stage 601 of the reset drive circuit 106 to be turned on, thereby discharging the Q node of the first stage 601 and discharging the first reset line R1.

The second scan signal Vg_2 generated by the second stage 202 of the scan drive circuit 102 by the second clock signal C2 is supplied to the second scan line G2 and, at the same time, is supplied to the reset terminal R of the first stage 201, thereby discharging the Q node of the first stage 201 and charging the QB node of the fist stage 201. Accordingly, if the second scan signal Vg_2 is generated, the pull-down transistor T_dn of the first stage 201 is turned on to discharge the first scan line G1 to the low level power supply voltage VSS and, at the same time, the pull-up transistor T_up of the second stage 202 is turned on to charge the second scan line G2 to the voltage of the second clock signal C2. Further, the second scan signal Vg_2 caused the second and fourth transistors T2, T4 of the second stage 602 of the reset drive circuit 106 to be turned on, thereby discharging the Q node of the second stage 602 and discharging the second reset line R2.

With such operations, the scan drive circuit 102 sequentially supplies the scan signals Vg_1 to Vg_n to the scan lines G1 to Gn and initializes the pre-stage stage at the same time. Further, the Q nodes are sequentially discharged in stages 601 to 60n of the reset drive circuit 106, and the reset lines R1 to Rn are sequentially discharged at the same time.

In the scan drive circuit 106, if the start signal Vst1 is input to the first stage 601, the Q node is charge in the first stage 601 and the QB node is discharged. If the first clock signal with a high voltage is supplied to the source electrode of the pull-up transistor T-up when the Q node of the first stage 601 is charged, the first reset signal Vr_1 is supplied to the first reset line R1 and, at the same time, is supplied to the set terminal S of the second stage 602 as the start signal, thereby charging the Q node of the second stage 602 and discharging the QB node of the second stage 602. Further, the first reset signal Vr_1 causes the first and third transistors T1, T3 of to the first stage 201 of the scan drive circuit 102 to be turned on, thereby discharging the Q node of the first stage 201 and discharging the first scan line G1.

The second reset signal Vr_2 generated in the second stage 602 of the reset drive circuit 106 by the second clock signal C2 is supplied to the second reset line R2 and, at the same time, is supplied to the reset terminal R of the first stage 601, thereby discharging the Q node of the first stage 601 and charging the QB node of the fist stage 601. Accordingly, if the second reset signal Vr_2 is generated, the pull-down transistor T_dn of the first stage 601 is turned on to discharge the first reset line R1 to the low level power supply voltage VSS and, at the same time, the pull-up transistor T_up of the second stage 602 is turned on to charge the second reset line R2 to the voltage of the second clock signal C2. Further, the second reset signal Vr_2 causes the first and third transistors T1, T3 of the second stage 202 of the scan drive circuit 102 to be turned on, thereby discharging the Q node of the first stage 202 and discharging the second scan line G2.

With such operations, the reset drive circuit 106 sequentially supplies the reset signal Vr_1 to Vr_n to the reset lines R1 to Rn and initializes the pre-stage stage at the same time. Further, the Q nodes are sequentially discharged in the stages 201 to 20n of the scan drive circuit 102 and the scan lines G1 to Gn are sequentially discharged at the same time.

FIG. 14 is a block diagram representing a third embodiment of the scan drive circuit and the reset drive circuit of FIG. 5 or 9 in detail.

Referring to FIG. 14, the reset drive circuit 306 simultaneously supplies the reset signal to adjacent two reset lines R1 to Rn, and includes n/2 number of stages that sequentially shift the reset signal.

A scan drive circuit 302 of the embodiment includes n number of stages which sequentially supply the scan signal to the scan lines G1 to Gn.

Figure 15:
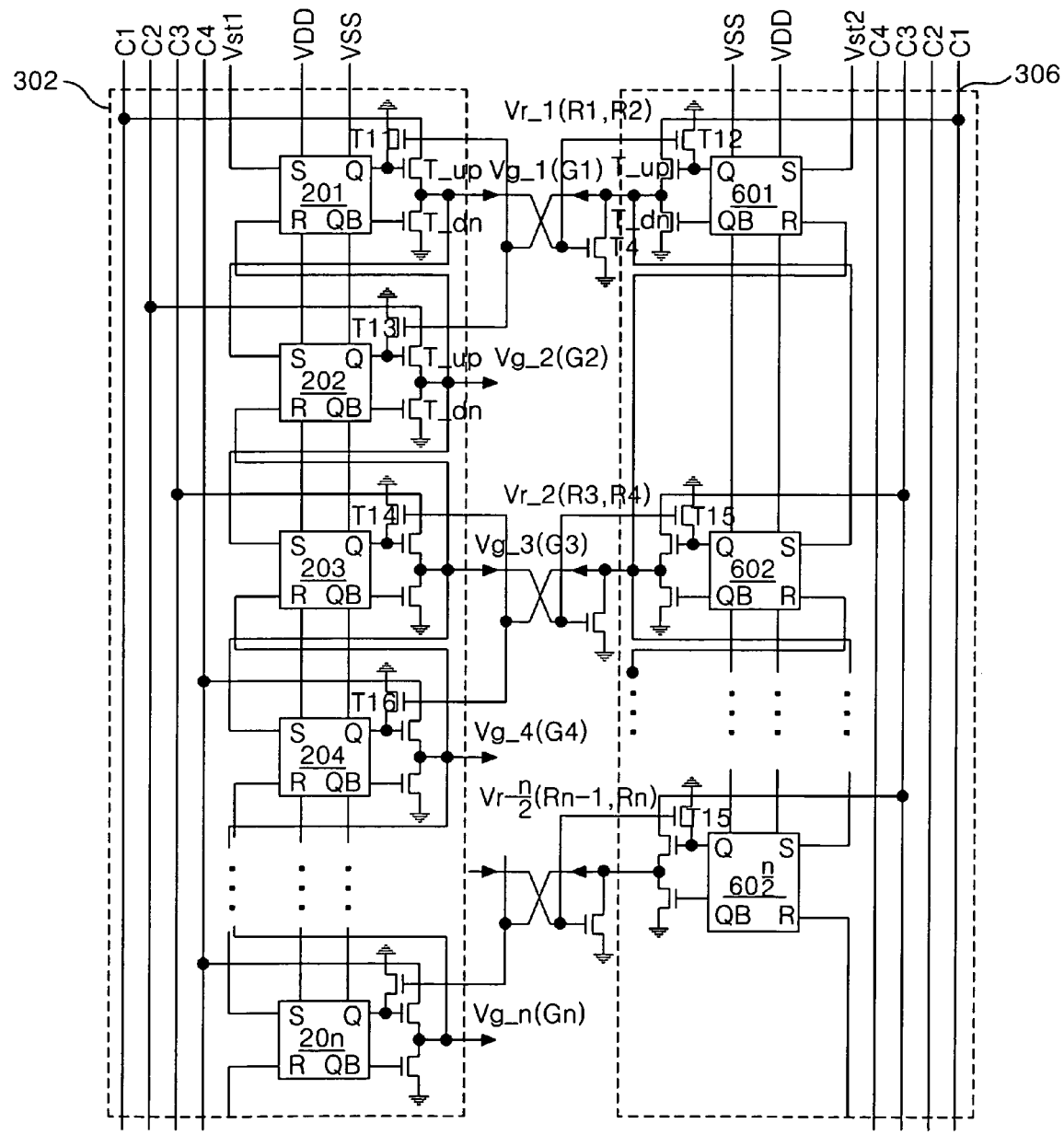
FIG. 15 is a circuit diagram representing a first embodiment of the scan drive circuit and the reset drive circuit shown in FIG. 14, in detail.
Figure 16:
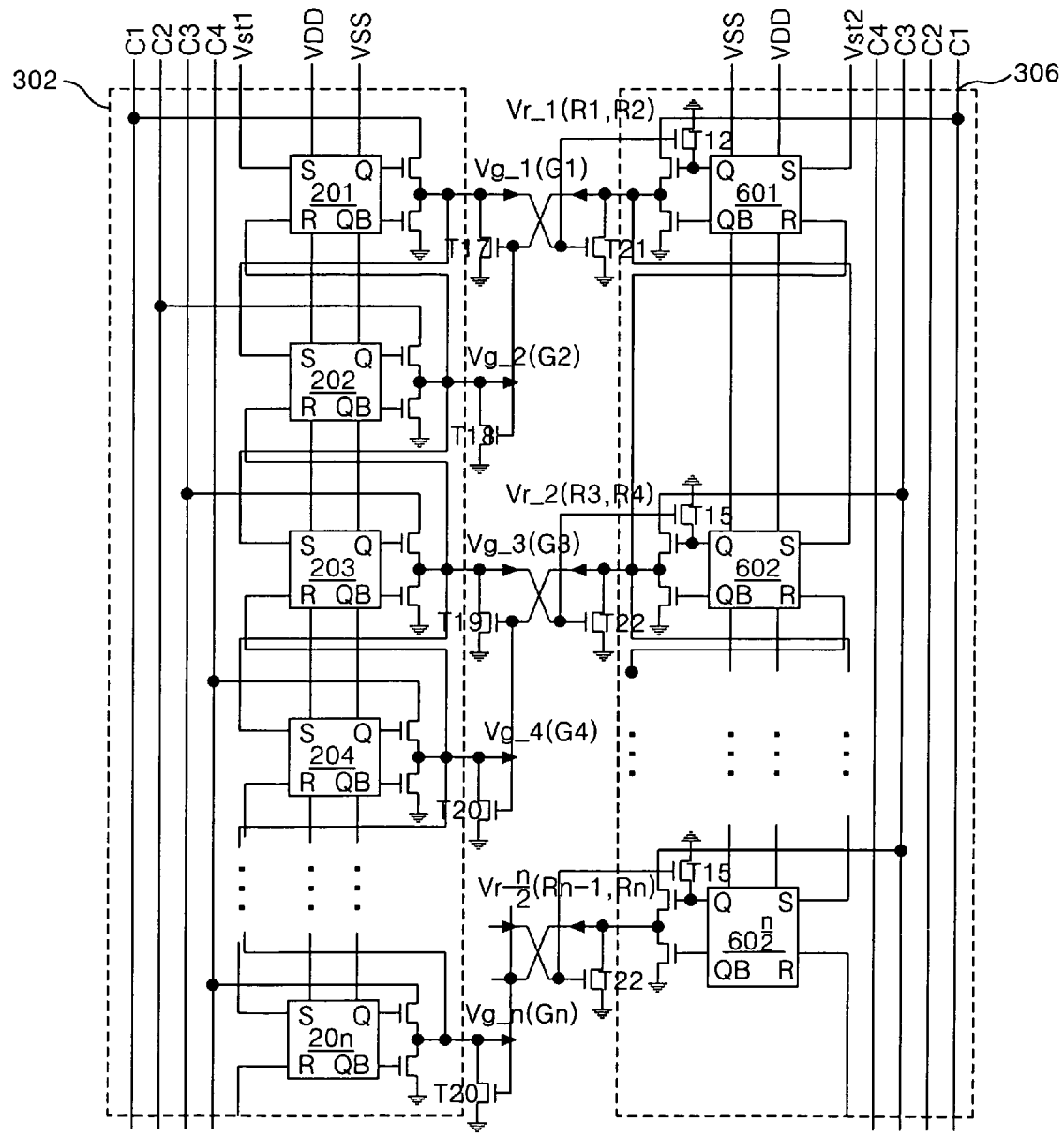
FIG. 16 is a circuit diagram representing a second embodiment of the scan drive circuit and the reset drive circuit shown in FIG. 14, in detail.
Figure 17:
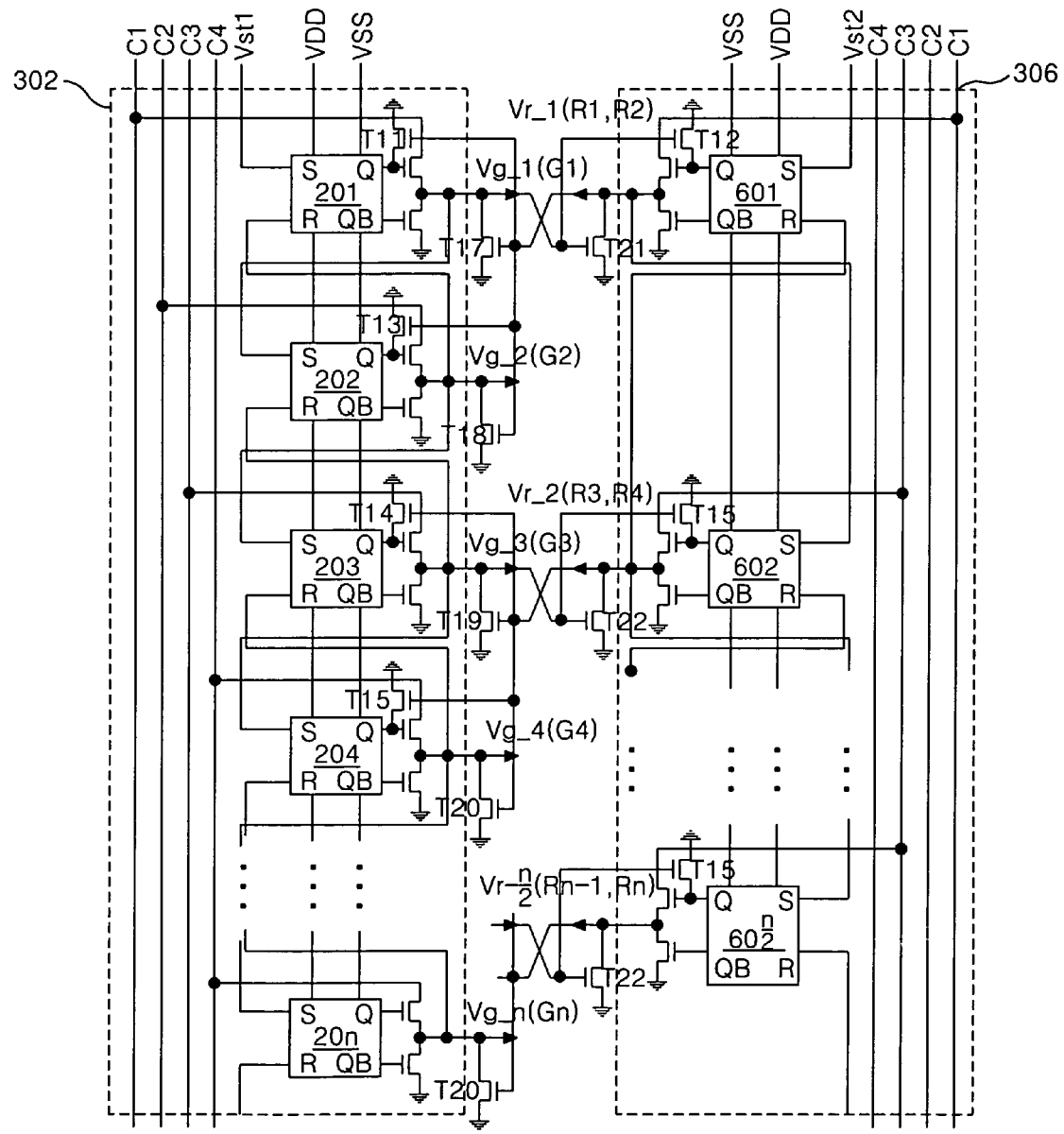
FIG. 17 is a circuit diagram representing a third embodiment of the scan drive circuit and the reset drive circuit shown in FIG. 14, in detail.

Each of the scan drive circuit 302 and the reset drive circuit 306 can be realized as in FIGS. 15 to 17.

Referring to FIG. 15, the scan drive circuit 302 includes: an eleventh transistor T11 that discharges the Q node of the $(4k+1)^{th}$ (k is a natural number not less than 0) stage 201, 205, . . . , 20n−3 in response to an odd number reset signal Vr_1, Vr_3, . . . , Vr_(n/2)−1; a thirteenth transistor T13 that discharges the Q node of the $(4k+2)^{th}$ stage 202, 206, . . . , 20n−2 in response to the odd number reset signal Vr_1, Vr_3, . . . , Vr_(n/2)−1; a fourteenth transistor T14 which discharges the Q node of the $(4k+3)^{th}$ stage 203, 207, . . . , 20n−1 in response to an even number reset signal Vr_2, Vr_4, . . . , Vr_(n/2); and a fifteenth transistor T15 that discharges the Q node of the $(4k+4)^{th}$ stage 204, 208, . . . , 20n in response to an even number reset signal Vr_2, Vr_4, . . . , Vr_(n/2).

The reset drive circuit 306 includes a twelfth transistor T12 that discharges the Q node of an odd number stage 601, 603, . . . , 60n/2−1 in response to an odd number scan signal Vg_1, Vg_3, . . . , Vr_(n−1) and a fifteenth transistor T15 that discharges the Q node of an even number stage 602, 604, . . . , 60n/2 in response to the odd number scan signal Vg_1, Vg_3, . . . , Vr_(n−1).

In the scan drive circuit 302, if the start signal Vst1 is input to a set terminal S of the first stage 201, the Q node is charged, and the QB node is discharged in the stage 201. Subsequently, the first scan signal Vg_1 is supplied to the first scan line G1 through a pull-up transistor T-up when the first clock signal C1 having a high logic voltage is input to the first stage 201 the Q node is charged. At the same time, the first scan signal Vg_1 is supplied to the set terminal S of the second stage 202 to charge the Q node of the second stage 202 and to discharge a QB node of the second stage 202. Further, the first scan signal Vg_1 is applied to a gate electrode of the twelfth transistor T12 of the reset drive circuit 306. Accordingly, the twelfth transistor T12 is turned on by the first scan signal Vg_1 to discharge the Q node of the first stage 601 in the reset drive circuit 306.

Subsequently, the second scan signal Vg_2 generated in the second stage 202 by the second clock signal C2 is supplied to the second scan line G2 and, at the same time, is supplied to the reset terminal R of the first stage 201 as a stage reset signal. The second scan signal Vg_2 discharges the Q node of the first stage 201 and charges the QB node. Accordingly, the first scan line G1 is discharged through the pull-down transistor T_dn when the second scan signal Vg_2 is generated.

A third scan signal Vg_3 output from the third stage 203 is supplied to the third scan line G3 and, at the same time, initializes the second stage 202 as the stage reset signal. The sixteenth transistor T16 is turned on to discharge the Q node that is formed in the second stage 602 of the reset drive circuit 306. With such operations, the scan drive circuit 302 sequentially supplies the scan signal to the scan lines G1 to Gn and discharges the Q node of the reset drive circuit 306.

In the reset drive circuit 306, if the start signal Vst2 is input to a set terminal S of the first stage 601, the Q node is charged and discharged in the stage 601. Subsequently, the first clock signal C1 having a high logic voltage is simultaneously supplied to the first and second reset lines R1 and R2 through the pull-up transistor T-up as a first reset signal Vr_1 when the Q node is charged. At the same time, the first reset signal Vr_1 is supplied to the set terminal S of the second stage 602 to charge the Q node of the second stage 602 and to discharge a QB node of the second stage 602. Further, the first reset signal Vr_1 is applied to a gate electrode of the eleventh and thirteenth transistors T11 and T13 of the scan drive circuit 302. Accordingly, the eleventh and thirteenth transistors T11 and T13 are turned on by the first reset signal Vr_1 to discharge the Q node of the first and second stages 201, 202 in the scan drive circuit 302.

Subsequently, the second reset signal Vr_2 generated in the second stage 602 by the third clock signal C3 is supplied to the third and fourth reset lines R3, R4 and, at the same time, is supplied to the reset terminal R of the first stage 601 as a stage reset signal. The second reset signal Vr_2 discharges the Q node of the first stage 601 and charges the QB node. Accordingly, the first reset line R1 is discharged through the pull-down transistor T_dn when the second reset signal Vr_2 is generated. Further, the second reset signal Vr_2 is applied to the gate electrode of the fourteenth and fifteenth transistors T14 and T15. Accordingly, the fourteenth and fifteenth transistors T14 and T15 are turned on by the second reset signal Vr_2 to discharge the Q node of the third and fourth stages 203, 204 in the scan drive circuit 302.

With such operations, the reset drive circuit 306 sequentially supplies the reset signal to the reset lines R1 to Rn and sequentially discharges the Q node of the scan drive circuit 302.

Referring to FIG. 16, the scan drive circuit 302 includes: a seventeenth transistor T17 that discharges the $(4k+1)^{th}$ scan line G1, G5, . . . , Gn−3 in response to an odd number reset signal Vr_1, Vr_3 , . . . , Vr_(n/2)−1; an eighteenth transistor T18 that discharges the $(4k+2)^{th}$ scan line G2, G6, . . . , Gn−2 in response to the odd number reset signal Vr_1, Vr_3, . . . , Vr_(n/2)−1; a nineteenth transistor T19 that discharges the $(4k+3)^{th}$ scan line G3, G7, . . . , Gn−1 in response to an even number reset signal Vr_2, Vr_4, . . . , Vr_n/2; and a twentieth transistor T20 that discharges the $(4k+4)^{th}$ scan line G4, G8, . . . , Gn in response to the even number reset signal Vr_2, Vr_4, . . . , Vr_n/2.

The reset drive circuit 306 includes a twelfth transistor T12 that discharges the Q node of an odd number stages 601, 603, . . . , 60n/2−1 in response to an odd number scan signals Vg_1, Vg_3, . . . , Vr_(n−1); a twenty first transistor T21 that discharges the $(4k+1)^{th}$ and $(4k+2)^{th}$ reset lines R1, R2, . . . , Rn−3, Rn−2 in response to the odd number scan signals Vg_1, Vg_3, . . . , Vg_(n/2)−1; a fifteenth transistor T15 that discharges the Q node of an even number stage 602, 604, . . . , 60n/2 in response to the odd number scan signals Vg_1, Vg_3, . . . , Vr_(n−1); and a twenty second transistor T22 that discharges the $(4k+3)^{th}$ and $4k^{th}$ reset lines R3, R4, . . . , Rn−1, Rn in response to the odd number scan signals Vg_1, Vg_3, . . . , Vg_(n/2)−1.

In the scan drive circuit 302, if the start signal Vst1 is input to the first stage 201, the Q node is charged in the first stage 201 and the QB node is discharged. If the first clock signal of a high voltage is supplied to the source electrode of the pull-up transistor T-up when the Q node of the first stage 201 is charged, the first scan signal Vg_1 is supplied to the first scan line G1 and, at the same time, is supplied to the set terminal S of the second stage 202 as the start signal, thereby charging the Q node of the second stage 202 and discharging the QB node of the second stage 202. Further, the first scan signal Vg_1 is applied to the gate electrode of the twelfth and twenty first transistors T12, T21 to discharge the Q node of the first stage 601 in the reset drive circuit 306 and to discharge the first and second reset lines R1 and R2.

The second scan signal Vg_2 generated in the second stage 202 of the scan drive circuit 302 when the second clock signal C2 is supplied to the second scan line G2 and, at the same time, is supplied to the reset terminal R of the first stage 201, thereby discharging the Q node of the first stage 201 and charging the QB node of the fist stage 201. Accordingly, if the second scan signal Vg_2 is generated, the pull-down transistor T_dn of the first stage 201 is turned on to discharge the first scan line G1 to the low level power supply voltage VSS and, at the same time, the pull-up transistor T_up of the second stage 202 is turned on to charge the second scan line G2 to the voltage of the second clock signal C2.

The third scan signal Vg_3 output from the third stage 203 is supplied to the third scan line G2 and, at the same time, initializes the second stage 202 as the stage reset signal. The fifteenth and twenty second transistors T15, T22 are turned on to discharge the Q node in the second stage 602 of the reset drive circuit 306 and to discharge the third and fourth reset lines R3, R4. With such operations, the scan drive circuit 302 sequentially supplies the scan signals Vg_1 to Vg_n to the scan lines G1 to Gn and sequentially discharges the Q node of the reset drive circuit 306 and the reset lines R1 to Rn.

In the first stage 601 of the reset drive circuit 306, if the start signal Vst2 is input to the set terminal S, the Q node is charged in the first stage 601 and the QB node is discharged. Subsequently, the first clock signal C1 having a high logic voltage is simultaneously supplied to the first and second reset lines R1, R2 as the first reset signal Vr_1 through the pull-up transistor T-up when the Q node is charged. At the same time, the first reset signal Vr_1 is supplied to the set terminal S of the second stage 602, thereby charging the Q node of the second stage 602 and discharging the QB node of the second stage 602. Further, the first reset signal Vr_1 is applied to the gate electrode of the seventeenth and eighteenth transistors T17 and T18 of the scan drive circuit 302. Accordingly, the seventeenth and eighteenth transistors T17 and T18 are turned on by the first reset signal Vr_1 to discharge the first and second scan lines G1, G2.

Subsequently, the second scan signal Vg_2 generated in the second stage 602 by the third clock signal C3 is supplied simultaneously to the third and fourth reset lines R3, R4 and, at the same time, is supplied to the reset terminal R of the first stage 601 as the stage reset signal. The second reset signal Vr_2 discharges the Q node of the first stage 601 and charges the QB node of the fist stage 601. Accordingly, the first reset line R1 is discharged through the pull-down transistor T_dn when the second reset signal Vr_2 is generated. Further, the second reset signal Vr_2 is applied to the gate terminal of the nineteenth and twentieth transistors T19 and T20. Accordingly, the nineteenth and twentieth transistors T19 and T20 are turned on by the second reset signal Vr_2 to discharge the third and fourth scan lines G3, G4.

With such operations, the reset drive circuit 306 sequentially supplies the reset signal Vr_1 to Vr_n to the reset lines R1 to Rn/2 and sequentially discharges the scan lines G1 to Gn.

Referring to FIG. 17, the scan drive circuit 302 includes: an eleventh transistor T11 that discharges the Q node of the $(4k+1)^{th}$ stages 201, 205, ..., 20n−3 in response to an odd number reset signals Vr_1, Vr_3, ..., Vr_(n/2)−1; a thirteenth transistor T13 that discharges the Q node of the $(4k+2)^{th}$ stages 202, 206, ..., 20n−2 in response to the odd number reset signals Vr_1, Vr_3, ..., Vr_(n/2)−1; a seventeenth transistor T17 that discharges the $(4k+1)^{th}$ scan lines G1, G5, ..., Gn−3 in response to the odd number reset signal Vr_1, Vr_3, ..., Vr_(n/2)−1; an eighteenth transistor T18 that discharges the $(4k+2)^{th}$ scan lines G2, G6, ..., Gn−2 in response to the odd number reset signals Vr_1, Vr_3, ..., Vr_(n/2)−1; a fourteenth transistor T14 that discharges the Q node of the $(4k+3)^{th}$ stages 203, 207 ..., 20n−1 in response to an even number reset signals Vr_2, Vr_4, ..., Vr_n/2; a sixteenth transistor T16 that discharges the Q node of the $(4k+4)^{th}$ stages 204, 208, ..., 20n in response to the even number reset signals Vr_2, Vr_4, ..., Vr_n/2; a nineteenth transistor T19 which discharges the $(4k+3)^{th}$ scan line G3, G7, ..., Gn−1 in response to the even number reset signals Vr_2, Vr_4, ..., Vr_n/2; and a twentieth transistor T20 that discharges the $(4k+4)^{th}$ scan line G4, G8, ..., Gn in response to the even number reset signals Vr_2, Vr_4, ..., Vr_n/2.

The reset drive circuit 306 includes a twelfth transistor T12 that discharges the Q node of an odd number stages 601, 603, ..., 60n/2−1 in response to an odd number scan signals Vg_1, Vg_3, ..., Vr_(n−1); a twenty first transistor T21 that discharges the $(4k+1)^{th}$ and $(4k+2)^{th}$ reset lines R1, R2, ..., Rn−3, Rn−2 in response to the odd number scan signals Vg_1, Vg_3, ..., Vg_(n/2)−1; a fifteenth transistor T15 that discharges the Q node of an even number stages 602, 604, ..., 60n/2 in response to the odd number scan signals Vg_1, Vg_3, ..., Vr_(n−1); and a twenty second transistor T22 that discharges the $(4k+3)^{th}$ and $4k^{th}$ reset lines R3, R4, ..., Rn−1, Rn in response to the odd number scan signals Vg_1, Vg_3, ..., Vg_(n/2)−1.

In the scan drive circuit 302, if the start signal Vst1 is input to the first stage 201, the Q node is charged in the first stage 201 and the QB node is discharged. If the first clock signal with a high voltage is supplied to the source electrode of the pull-up transistor T-up when the Q node of the first stage 201 is charged, the first scan signal Vg_1 is supplied to the first scan line G1 and, at the same time, is supplied to the set terminal S of the second stage 202 as the start signal, thereby charging the Q node of the second stage 202 and discharging the QB node of the second stage 202. Further, the first scan signal Vg_1 is applied to the gate electrode of the twelfth and twenty first transistors T12, T21 to discharge the Q node of the first stage 601 in the reset drive circuit 306 and to discharge the first and second reset lines R1 and R2.

The second scan signal Vg_2 generated in the second stage 202 of the scan drive circuit 302 by the second clock signal C2 is supplied to the second scan line G2 and, at the same time, is supplied to the reset terminal R of the first stage 201, thereby discharging the Q node of the first stage 201 and charging the QB node of the fist stage 201. Accordingly, if the second scan signal Vg_2 is generated, the pull-down transistor T_dn of the first stage 201 is turned on to discharge the first scan line G1 to the low level power supply voltage VSS and, at the same time, the pull-up transistor T_up of the second stage 202 is turned on to charge the second scan line G2 to the voltage of the second clock signal C2.

The third scan signal Vg_3 output from the third stage 203 is supplied to the third scan line G2 and, at the same time, initializes the second stage 202 as the stage reset signal. The fifteenth and twenty second transistors T15, T22 are turned on to discharge the Q node in the second stage 602 of the reset drive circuit 306 and to discharge the third and fourth reset lines R3, R4. With such operations, the scan drive circuit 302 sequentially supplies the scan signals Vg_1 to Vg_n to the scan lines G1 to Gn and sequentially discharges the Q node of the reset drive circuit 306 and the reset lines R1 to Rn.

In the first stage 601 of the reset drive circuit 306, if the start signal Vst2 is input to the set terminal S, the Q node is charged in the first stage 601 and the QB node is discharged. Subsequently, the first clock signal C1 having a high logic voltage is simultaneously supplied to the first and second reset lines R1, R2 as the first reset signal Vr_1 through the pull-up transistor T-up when the Q node is charged. At the same time, the first reset signal Vr_1 is supplied to the set terminal S of the second stage 602, thereby charging the Q node of the second stage 602 and discharging the QB node of the second stage 602. Further, the first reset signal Vr_1 is applied to the gate electrode of the eleventh, thirteenth, seventeenth and eighteenth transistors T11, T13, T17 and T18 of the scan drive circuit 302. Accordingly, the eleventh, thirteenth, seventeenth and eighteenth transistors T11, T13, T17 and T18 are turned on by the first reset signal Vr_1 to discharge the Q nodes of the first and second stages 201, 202 in the scan drive circuit 302 and to discharge the first and second scan lines G1, G2.

Subsequently, the second scan signal Vg_2 generated in the second stage 602 by the third clock signal C3 is supplied simultaneously to the third and fourth reset lines R3, R4 and, at the same time, is supplied to the reset terminal R of the first stage 601 as the stage reset signal. The second reset signal Vr_2 discharges the Q node of the first stage 601 and charges the QB node of the fist stage 601. Accordingly, the first reset line R1 is discharged through the pull-down transistor T_dn when the second reset signal Vr_2 is generated. Further, the second reset signal Vr_2 is applied to the gate terminal of the fourteenth, sixteenth, nineteenth and twentieth transistors T14, T16, T19 and T20. Accordingly, the fourteenth, sixteenth, nineteenth and twentieth transistors T14, T16, T19 and T20 are turned on by the second reset signal Vr_2 to discharge the Q nodes of the third and fourth stages 203, 204 in the scan drive circuit 302 and to discharge the third and fourth scan lines G3, G4 at the same time.

With such operations, the reset drive circuit 306 sequentially supplies the reset signal Vr_1 to Vr_n to the reset lines R1 to Rn/2 and sequentially discharges the Q nodes of the scan drive circuit 302 and the scan lines G1 to Gn.

As described above, the OLED display device according to the present invention can improve the reliability of the OLED drive circuit by preventing the characteristic change caused by the deterioration of the OLED drive device, especially, the drive transistor, and has the advantage of being thin and reducing cost by way of embedding the scan drive circuit and the reset drive circuit in the organic light emitting diode panel.

Further, the OLED display device according to the present invention discharges the Q nodes of the scan drive circuit and reset drive circuit and the scan lines and reset lines once again by use of the output of the drive circuits which are different from each other, thereby solving a reliability problem due to deterioration of the circuit caused by a partial charge that is generated upon driving.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
   a pixel array having a plurality of scan lines and a plurality of data lines that cross each other, a plurality of power voltage supply lines to which a high level power supply voltage is supplied and that are substantially parallel to the data lines, a plurality of reset lines substantially parallel to the scan lines, a plurality of organic light emitting diodes that emit light due to the high level power supply voltage from the power voltage supply line, and a plurality of organic light emitting diode drive circuits that drive the organic light emitting diode with data from the data line in response to a scan signal from the scan line and that is initialized in response to a reset signal from the reset line;
   a scan drive circuit that supplies the scan signals to the scan lines by plurality of stages that each have a first Q node, a first QB node, a first pull-up transistor that supplies the scan signal to the scan line in response to a voltage of the first Q node and a first pull-down transistor that discharges the scan line in response to a voltage of the first QB node;
   a reset drive circuit that supplies the reset signals to the reset lines by a plurality of stages that each have a second Q node, a second QB node, a second pull-up transistor that supplies the reset signal to the reset line in response to a voltage of the second Q node and a second pull-down transistor that discharges the reset line in response to the voltage of a second QB node;
   a first transistor that discharges the first Q node of the scan drive circuit in response to the reset signal, wherein the first transistor has a source electrode connected to the first Q node connected to each of the stages of the scan drive circuit, a gate electrode connected to the reset line and a drain electrode connected to a low level power supply voltage source; and
   a second transistor that discharges the second Q node of the reset drive circuit in response to the scan signal, wherein the second transistor has a source electrode connected to the second Q node connected to each of the stages of the reset drive circuit, a gate electrode connected to the scan line and a drain electrode connected to the low level power supply voltage source.

2. The organic light emitting diode display device according to claim 1, wherein the pixel array is disposed between the scan drive circuit and the reset drive circuit.

3. The organic light emitting diode display device according to claim 1, wherein: pairs of adjacent reset lines are connected to each other and the reset signal is supplied thereto at the same time; the connected reset lines are commonly connected to the gate electrodes that are formed in the first transistors respectively; and the scan line is connected to the gate electrode of the second transistor in a one-to-one relationship.

4. The organic light emitting diode display device according to claim 3, wherein the number of stages of the reset drive circuit is less than the number of stages of the scan drive circuit.

5. The organic light emitting diode display device according to claim 1, comprising:
   a third transistor that discharges the scan line in response to the reset signal; and
   a fourth transistor that discharges the reset line in response to the scan signal.

6. The organic light emitting diode display device according to claim 5, wherein the third transistor has a source electrode connected to the scan line, a gate electrode connected to the reset line and a drain electrode connected to a low level power supply voltage source, and the fourth transistor has a source electrode connected to the reset line, a gate electrode connected to the scan line and a drain electrode connected to the low level power supply voltage source.

7. The organic light emitting diode display device according to claim 6 wherein: pairs of adjacent reset lines are connected to each other and the reset signal is supplied thereto at the same time; the connected reset lines are commonly connected to the gate electrodes that are formed in the third transistors respectively; and the scan line is connected to the gate electrode of the fourth transistor in a one-to-one relationship.

8. The organic light emitting diode display device according to claim 7, wherein the number of stages of the reset drive circuit is less than the number of stages of the scan drive circuit.

9. The organic light emitting diode display device according to claim 1, wherein the organic light emitting diode drive circuit includes:
- a switching transistor that supplies the data to a first node in response to the scan signal;
- a drive transistor that controls a current, that flows in the organic light emitting diode, by a voltage of the first node; and
- a reset transistor that discharges the first node in response to the reset signal.

10. The organic light emitting diode display device according to claim 9, wherein transistors within the pixel array and transistors within the scan drive circuit and reset drive circuit are amorphous silicon transistors.

11. The organic light emitting diode display device according to claim 9, wherein transistors within the pixel array and transistors within the scan drive circuit and reset drive circuit are poly silicon transistors.

12. The organic light emitting diode display device according to claim 9, wherein the reset signal is delayed versus the scan signal.

13. The organic light emitting diode display device according to claim 12, wherein the reset signal is generated approximately in ½ a frame period after the scan signal.

14. The organic light emitting diode display device according to claim 9, wherein the stages of the scan drive signal include:
- a $(n-1)^{th}$ stage that outputs a $(n-1)^{th}$ scan signal in response to one of a scan start signal and a $(n-2)^{th}$ scan signal; and
- an $n^{th}$ stage that outputs an $n^{th}$ scan signal in response to the $(n-1)^{th}$ scan signal,
- wherein the $(n-1)^{th}$ stage discharges the first Q node and charges the first QB node in response to the $n^{th}$ scan signal.

15. The organic light emitting diode display device according to claim 14, wherein the stages of the reset drive signal include:
- a $(n-1)^{th}$ stage that outputs a $(n-1)^{th}$ reset signal in response to one of a reset start signal and a $(n-2)^{th}$ reset signal; and
- an $n^{th}$ stage that outputs an $n^{th}$ reset signal in response to the $(n-1)^{th}$ reset signal,
- wherein the $(n-1)^{th}$ stage discharges the second Q node and charges the second QB node in response to the $n^{th}$ reset signal.

16. An organic light emitting diode display device, comprising:
- a pixel array having a plurality of scan lines and a plurality of data lines that cross each other, a plurality of power voltage supply lines to which a high level power supply voltage is supplied and that are substantially parallel to the data lines, a plurality of reset lines substantially parallel to the scan lines, a plurality of organic light emitting diodes that emit light due to the high level power supply voltage from the power voltage supply line, and a plurality of organic light emitting diode drive circuits that drive the organic light emitting diode with data from the data line in response to a scan signal from the scan line and that is initialized in response to a reset signal from the reset line;
- a scan drive circuit that supplies the scan signals to the scan lines by a plurality of stages that each have a first Q node, a first QB node, a first pull-up transistor that supplies the scan signal to the scan line in response to a voltage of the first Q node and a first pull-down transistor that discharges the scan line in response to a voltage of the first QB node;
- a reset drive circuit that supplies the reset signals to the reset lines by a plurality of stages that each have a second Q node, a second QB node, a second pull-up transistor that supplies the reset signal to the reset line in response to a voltage of the second Q node and a second pull-down transistor that discharges the reset line in response to a voltage of the second QB node;
- a first transistor that discharges the scan line in response to the reset signal, wherein the first transistor has a source electrode connected to the scan line, a gate electrode connected to the reset line and a drain electrode connected to a low level power supply voltage source; and
- a second transistor that discharges the reset line in response to the scan signal, wherein the second transistor has a source electrode connected to the reset line, a gate electrode connected to the scan line and a drain electrode connected to the low level power supply voltage source.

17. The organic light emitting diode display device according to claim 16, wherein the pixel array is disposed between the scan drive circuit and the reset drive circuit.

18. The organic light emitting diode display device according to claim 16, wherein the reset signal is delayed versus the scan signal.

19. The organic light emitting diode display device according to claim 18, wherein the reset signal is generated approximately in ½ a frame period after the scan signal.

20. The organic light emitting diode display device according to claim 16, wherein the stages of the scan drive signal include:
- a $(n-1)^{th}$ stage that outputs a $(n-1)^{th}$ scan signal in response to one of a scan start signal and a $(n-2)^{th}$ scan signal; and
- an $n^{th}$ stage that outputs an $n^{th}$ scan signal in response to the $(n-1)^{th}$ scan signal,
- wherein the $(n-1)^{th}$ stage discharges the first Q node and charges the first QB node in response to the $n^{th}$ scan signal.

21. The organic light emitting diode display device according to claim 20, wherein the stages of the reset drive signal include:
- a $(n-1)^{th}$ stage that outputs a $(n-1)^{th}$ reset signal in response to one of a reset start signal and a $(n-2)^{th}$ reset signal; and
- an $n^{th}$ stage that outputs an $n^{th}$ reset signal in response to the $(n-1)^{th}$ reset signal,
- wherein the $(n-1)^{th}$ stage discharges the second Q node and charges the second QB node in response to the $n^{th}$ reset signal.

22. The organic light emitting diode display device according to claim 16, wherein pairs of adjacent reset lines are connected to each other and the reset signal is supplied thereto at the same time; the connected reset lines are commonly connected to the gate electrodes that are formed in the first transistors respectively; and the scan line is connected to the gate electrode of the second transistor in a one-to-one relationship.

23. The organic light emitting diode display device according to claim 22, wherein the number of stages of the reset drive circuit is less than the number of stages of the scan drive circuit.

24. The organic light emitting diode display device according to claim 16, wherein the organic light emitting diode drive circuit includes:

a switching transistor that supplies the data to a first node in response to the scan signal;

a drive transistor that controls a current, that flows in the organic light emitting diode, by a voltage of the first node; and a reset transistor that discharges the first node in response to the reset signal.

25. The organic light emitting diode display device according to claim 24, wherein transistors within the pixel array and transistors within the scan drive circuit and reset drive circuit are amorphous silicon transistors.

26. The organic light emitting diode display device according to claim 25, wherein transistors within the pixel array and transistors within the scan drive circuit and reset drive circuit are poly silicon transistors.

* * * * *